(12) United States Patent
Koriyama

(10) Patent No.: US 7,276,987 B2
(45) Date of Patent: Oct. 2, 2007

(54) HIGH FREQUENCY LINE-TO-WAVEGUIDE CONVERTER AND HIGH FREQUENCY PACKAGE

(75) Inventor: Shinichi Koriyama, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/696,745

(22) Filed: Oct. 29, 2003

(65) Prior Publication Data

US 2004/0155723 A1    Aug. 12, 2004

(30) Foreign Application Priority Data

Oct. 29, 2002 (JP) ............................ P2002-314410
Mar. 27, 2003 (JP) ............................ P2003-087350

(51) Int. Cl.
*H01P 5/107* (2006.01)

(52) U.S. Cl. ........................................ 333/26; 333/246

(58) Field of Classification Search ................... 333/26, 333/239, 246, 248; 428/209; 343/767
See application file for complete search history.

(56) References Cited

U.S. PATENT DOCUMENTS 5,982,256 A * 11/1999 Uchimura et al. .......... 333/239
6,060,959 A    5/2000 Yakuwa ...................... 333/26
6,239,669 B1   5/2001 Koriyama et al. ............. 333/26
6,359,590 B2 * 3/2002 Takenoshita .......... 343/700 MS
6,535,090 B1 * 3/2003 Matsuzuka et al. ......... 333/246
6,572,955 B2 * 6/2003 Terashi et al. .............. 428/209
6,580,335 B1 * 6/2003 Iizuka et al. .................. 333/26
6,822,528 B2 * 11/2004 Dawn et al. .................. 333/26
6,888,429 B2 * 5/2005 Okajima et al. ............. 333/250

FOREIGN PATENT DOCUMENTS

| EP | 0 905 814 | 3/1999 |
| JP | 2001-177312 | 6/2001 |
| WO | 96/27913 | 9/1996 |

* cited by examiner

*Primary Examiner*—Dean Takaoka
(74) *Attorney, Agent, or Firm*—Hogan & Hartson LLP

(57) ABSTRACT

A high frequency line-waveguide converter comprises a high frequency line including a dielectric layer, a line conductor disposed on an upper surface of the dielectric layer, and a ground conductor layer disposed on the same surface so as to surround one end of the line conductor, a slot formed in the ground conductor layer so as to be substantially orthogonal to the one end of the line conductor and coupled to the line conductor, a shield conductor part disposed on a side of or in an inside of the dielectric layer so as to surround the one end of the line conductor and the slot, and a waveguide disposed at the lower side of the dielectric layer so that an opening is made opposite to the one end of the line conductor and the slot, and electrically connected to the shield conductor part.

15 Claims, 14 Drawing Sheets

$H = (2n-1)\lambda/4$ $H = (2n-1)\lambda/4$

OPEN TIP

SHORT-CIRCUIT TIP

SHORT-CIRCUIT TIP (n=1)

HIGH FREQUENCY LINE-TO-WAVEGUIDE CONVERTER AND HIGH FREQUENCY PACKAGE

BACKGROUND OF THE INVENTION

1. Field of the Invention

The present invention relates to a high frequency line-to-waveguide converter in which a high frequency line, such as a coplanar line or a coplanar line having ground, forming a high frequency circuit and used in a microwave or milimeter wave region is converted into a waveguide, and connection between the high frequency circuit and an antenna or between high frequency circuits is performed through the waveguide, so that mounting of a system can be easily performed.

Besides, the invention relates to a high frequency package for easily connecting a high frequency electronic component used in a microwave or milimeter wave region to a waveguide.

2. Description of the Related Art

In recent years, we enter the advanced information age, and with respect to a high frequency signal used for information transmission, studies have been carried out to utilize frequencies in the range from a microwave of 1 to 30 GHz to a milimeter wave of 30 to 300 GHz, and an application system using a high frequency signal of a milimeter wave, such as an inter-vehicular radar, is also proposed.

In such a high frequency system, there is a problem that since the frequency of a high frequency signal is high, the attenuation of the high frequency signal in a high frequency line constituting a circuit becomes large. For example, in the case where the high frequency line has a microstrip line structure, dielectric loss in a dielectric substrate becomes large in proportion to a frequency (when dielectric loss tangent is independent of a frequency), and conductor loss in the line conductor becomes large in proportion to a square root of the frequency. From this, even when the same microstrip line is used, when the frequency to be used becomes high from 1 GHz to 10 GHz, the dielectric loss becomes 10 times as high, and the conductor loss becomes about 3.2 times as high, and there is a problem that in order to compensate the loss, it becomes necessary to heavily use expensive high frequency components having low noise, high efficiency and high gain, and the system becomes expensive.

It is known that as compared with the high frequency line of the microstrip line structure as stated above, the transmission loss of a high frequency signal in a waveguide is low. For example, the loss of a waveguide WR-28 used in a band of 26 GHz to 40 GHz is about 0.005 dB/cm at 40 GHz, and this is remarkably smaller than the loss of about 1 dB/cm of the microstrip line using an aluminum substrate. This is because as compared with the normal high frequency line (generally designed to have an impedance of 50 Ω) by the microstrip line or the like, the impedance of the waveguide is high (although changed according to the frequency, it is designed to be of the order of approximately 500 Ω), and in the normal high frequency line, although the contribution of electric field energy transmitted in the dielectric substance is large in relation to the transmitted signal energy, the waveguide has such a structure that air having a dielectric loss tangent of almost 0 is used as the dielectric substance, a current flowing through the wall of the waveguide, which causes relatively low magnetic energy, may be small, and since the current flows through a relatively wide area of the wall of the waveguide, electric resistance becomes small and the conductor loss becomes small.

Besides, waveguides are generally connected to each other by screws. Thus, attachment and detachment can be easily performed. For example, when the waveguide is used for the connection of a high frequency circuit module and an antenna, their respective waveguide ports are used to carry out their respective checks before assembly, and a high frequency front end can be assembled by combining good components with each other, and the manufacture yield can be raised. From these, the front end using the waveguide is conventionally often adopted for transmission between the high frequency circuit module and the antenna, in which a transmission distance often becomes long.

FIG. 14 is a sectional view for explaining a structure of such a high frequency front end. According to FIG. 14, a front end 10 is constructed such that a module 11 and an antenna 12 are connected through a waveguide member 13. The module 11 is mounted on a metal chassis 15 having a waveguide opening 14. Besides, in this front end 10, there is constructed a high frequency line-to-waveguide converter 18 including a microstrip substrate 16 in which a microstrip line as a high frequency line is formed and a waveguide constituted by the waveguide opening 14 and a short circuit termination member 17. A wiring substrate 19 on which a high frequency component is mounted is connected to the microstrip line of the microstrip substrate 16 by wire bonding.

The high frequency line-to-waveguide converter 18 in this front end 10 is of the type in which at a position apart from the short circuit termination surface of the short circuit termination member 17 by a distance of ¼ of a wavelength (guide wavelength), in the waveguide, of an electromagnetic wave excited by a high frequency signal, a probe (a portion where although a line conductor is extended, a ground conductor is not formed) formed on the microstrip substrate 16 is inserted from the side of the waveguide by a length of approximately ¼ of a signal wavelength. This probe functions as an antenna in the waveguide, and radiates a high frequency signal as an electromagnetic wave into the waveguide. The half of the electromagnetic wave radiated into the waveguide is directly transmitted to the lower waveguide member 13, and the remaining half is transmitted toward the upper short circuit termination member 17. The phase of the electromagnetic wave transmitted toward the short circuit termination member 17 is inverted at the short circuit termination surface and is totally reflected. The totally reflected electromagnetic wave is returned to the probe portion, and is combined with the electromagnetic wave directly radiated downward from the probe. At this time, when the distance between the probe and the short circuit termination surface is made ¼ of the guide wavelength, the length of the both-way optical path starting from the probe and returning to the probe via the short circuit termination surface becomes the ½ wavelength, and the phase of the electromagnetic wave reflected at the short circuit termination surface becomes opposite to that of the electromagnetic wave directly radiated from the probe by the optical path difference. Eventually, the phase of the electromagnetic wave reflected at the short circuit termination surface is inverted when it is reflected at the short circuit termination surface, and further, the phase is reversed by the optical path difference, and becomes the same as the phase of the electromagnetic wave directly radiated downward from the probe, and the electromagnetic wave is transmitted to the lower waveguide member 13.

At this time, in order to cause the probe to function as the antenna, the length of the probe inserted into the waveguide is required to be made exactly ¼ of the wavelength of the transmission line. Besides, in order to cause the phase of the electromagnetic wave radiated from the probe upward and reflected at the short circuit termination surface to become the same phase as the phase of the electromagnetic wave radiated downward from the probe, the distance between the probe and the short circuit termination surface is required to be made exactly ¼ of the guide wavelength. Accordingly, the characteristic is greatly changed by the insertion position of the microstrip substrate 16, which functions as the antenna, into the waveguide, and the relation between the position of the microstrip substrate 16 and the position of the short circuit termination surface of the short circuit termination member 17.

Since the high frequency line-to-waveguide converter 10, together with the wiring substrate 19, is constructed on the metal chassis 15 by assembly, there is a problem that in the case where conversion loss of the high frequency line-to-waveguide converter becomes large by position shift of the respective members, the assembly becomes poor, and all of the used members become wasteful. Besides, the related art is disclosed in WO96/27913 and Japanese Unexamined Patent Publication JP-A 2001-177312 (2001).

FIG. 15 is a sectional view for explaining a structure of a high frequency line to waveguide converter. According to FIG. 15, a front end 20 is constructed such that a high frequency package 21 is connected to an antenna 22 through a waveguide 23. The high frequency package 21 is constructed such that a conversion substrate 26 having a built-in waveguide converter 25 is joined to a metal base 24. The waveguide converter 25 converts a plane circuit 28 for transmitting a high frequency signal processed by a high frequency electronic component 27 mounted on the high frequency package 21 into a waveguide mode 31 through a slot 30 formed in a ground layer 29 in the inside of the conversion substrate 26.

In this high frequency package 21, it is necessary to provide the area for mounting of the high frequency electronic component 27, together with the waveguide converter 25, in the conversion substrate 26, and there is a problem that in the case where the number of parts of the high frequency electronic component 27 is increased, the size becomes large, and warp or fracture can occur due to the mismatch in thermal expansion between the conversion substrate 26 and the metal base 24 at the time of assembly of the package. Besides, the related art is disclosed in U.S. Pat. No. 6,239,669.

In order to solve the problem as stated above, for example, WO96/27913 proposes a microstrip-waveguide transition including a microstrip line formed on an upper surface of a dielectric substrate and a slot formed in a lower ground conductor layer and functioning as an antenna. In the microstrip-waveguide transition proposed by WO96/27913, the thickness of the dielectric substance from the slot to a waveguide is made ¼ of a signal wavelength of a high frequency signal. This is such that a difference in impedance between the slot and the waveguide is adjusted by a ¼ wavelength matching device of the dielectric substance.

According to this structure, an electromagnetic wave radiated from the slot and reflected at a boundary between the matching device of the dielectric substance and the waveguide is reflected at the ground conductor layer in which the slot is formed, and is again returned to the boundary between the matching device and the waveguide. At this time, when the thickness of the matching device is made ¼ of the signal wavelength, an optical path difference between the electromagnetic wave (reflected wave), which is reflected at the boundary and is again returned, and the electromagnetic wave (direct wave) directly transmitted from the slot to the boundary becomes ½ of the signal wavelength, and the phase is inverted when the reflected wave is reflected at the ground conductor layer, and accordingly, the direct wave and the reflected wave have the same phase at the boundary to intensify each other, and are transmitted to the waveguide.

According to this conversion structure, although the conversion characteristic is greatly changed by the thickness of the matching device, in this case, since the matching device is integrally constructed in the dielectric substrate, it becomes possible to lessen variation in the thickness of the dielectric substance, and variation in the conversion characteristic can be made small. Besides, when the dielectric substrate at the microstrip side is covered with a cap, it also becomes possible to airtightly seal the microstrip side at the same time as the conversion into the waveguide.

In this structure, electromagnetic coupling between different layers is used for coupling of the high frequency line and the slot. This electromagnetic coupling, together with the foregoing matching device, plays a main role in the conversion operation. However, the characteristic of the electromagnetic coupling is changed by the size of the slot and the length of a stub (a portion where the high frequency line protrudes from the slot), that is, the relative positional relation between the high frequency line and the slot. Accordingly, in this structure, the conversion characteristic is greatly changed by the size of the slot and the length of the stub, and since the high frequency line and the slot are disposed in the different layers, there is a problem that the length of the stub determined from the relative positional relation between both is apt to vary, and the conversion characteristic is apt to change.

Besides, in this structure, since the slot is placed in the inside of the dielectric substrate, there is a problem that it is difficult to check the length of the slot, the width of the slot, and the length of the stub from the outside, and it is also difficult to stabilize the characteristic by making a check.

In order to solve the problem as stated above, for example, a high frequency line-to-waveguide converter is conceivable in which a slot functioning as an antenna is formed at a tip of a coplanar line on a surface of a dielectric substrate, a waveguide is connected to a rear surface of the dielectric substrate at a position opposite to the slot, and a shield conductor part for connecting the waveguide and a ground conductor layer of the coplanar line is provided along an opening of the waveguide. The coplanar line is constituted by a line conductor and ground conductor layers disposed at both sides thereof, and the ground conductor layers in this case function as the ground or the coplanar line, and further function also as reflecting plates for again reflecting an electromagnetic wave (reflected wave) radiated from the slot, reflected at the boundary between the dielectric substrate and the waveguide and returned to the slot side. According to this converter, when the distance from the slot to the boundary between the dielectric substrate and the waveguide is set to ¼ of the wavelength of the electromagnetic wave transmitted through the dielectric layer, an optical path difference between the reflected wave, which is radiated from the slot, is reflected at the boundary between the dielectric substrate and the waveguide, is again reflected at the ground conductor layer and reaches the boundary, and the electromagnetic wave (direct wave) directly transmitted to the boundary from the slot becomes equal to ½ of the wavelength of the electromagnetic wave, and the phase of the magnetic field of the reflected wave is inverted when it is reflected at the boundary between the dielectric substrate and the waveguide, and accordingly, the direct wave and the reflected wave have the same phase at the boundary to intensify each other, and are transmitted to the waveguide. That is, the dielectric substrate intervening between the slot and the waveguide and having the thickness set to ¼ of the wavelength of the electromagnetic wave functions as a matching device of the slot and the waveguide whose impedances are different from each other.

However, in this structure, since the coplanar line is in contact with the matching device of the dielectric substrate, part of the electromagnetic wave of the signal transmitted through the coplanar line is distributed in the matching device, and this generates an unnecessary electromagnetic wave distribution (here, called a mode) in the matching device, and there is a fear that the transmission of the high frequency signal to the waveguide is impeded. For example, immediately under the line conductor of the coplanar line, the magnetic field by the signal becomes parallel to the surface of the dielectric substrate. This magnetic field excites a TM mode as a resonant mode at the time when the matching device is made the dielectric waveguide, and the signal energy of a TE mode as a transmission mode shifts to the TM mode and resonates, and the signal is reflected, and accordingly, there is a case where the conversion into the waveguide can not be excellently performed.

In order to solve the problem an stated above, it is conceivable that for example, the conversion substrate 26 including only the waveguide converter 25 is fabricated, and is connected to the metal base 24. By doing so, it becomes possible to lessen the conversion substrate 26, the residual stress after the assembly due to the mismatch in thermal expansion between the conversion substrate 26 and the metal base 24 becomes low, and it is possible to prevent the warp or fracture of the high frequency package 21.

However, in this structure, when the upper surface of the conversion board 26 and the upper surface of the high frequency electronic component 27 are made the same surface, although the respective signal lines can be connected by wire bonding or ribbon bonding at a relatively short distance, since the thickness of the conversion substrate 26 including the waveguide converter 25 is generally overwhelmingly thicker than the thickness of the high frequency electronic component 27 used in the microwave or millimeter wave range, a connection distance between grounds at the respective lower surfaces becomes longer than a connection between signal conductors, and there is a case where the phase of the electric potential of the signal conductor deviates from the phase of the electric potential of the ground conductor at the connection part, and the high frequency signal can not be excellently transmitted.

SUMMARY OF THE INVENTION

The invention has been made in view of the foregoing problems, and an object thereof is to provide a high frequency line-to-waveguide converter which has a high conversion efficiency and a small variation in conversion characteristic.

Another object of the invention is to provide a high frequency line-to-waveguide converter in which an unnecessary mode does not easily occur and a conversion efficiency is high.

Still another object of the invention is to provide a high frequency package in which a conversion substrate including only a waveguide converter 65 is connected to a metal base to prevent a warp or a crack of the high frequency package, and transmission of a high frequency signal at a connection part between the conversion substrate and a high frequency electronic component is excellent.

The invention provides a high frequency line-to-waveguide converter comprising:

a high frequency line including a dielectric layer, a line conductor disposed on one surface of the dielectric layer, and a ground conductor layer disposed on the same surface so as to surround one end of the line conductor;

a slot formed in the ground conductor layer so as to be substantially orthogonal to the one end of the line conductor and coupled to the high frequency line;

a shield conductor part disposed on a side of or in an inside of the dielectric layer so as to surround the one end of the line conductor and the slot; and a waveguide disposed on a side of the other surface of the dielectric layer so that an opening is opposite to the one end of the line conductor and the slot, and electrically connected to the shield conductor part.

According to the invention, since the high frequency line including the line conductor disposed on the one surface of the dielectric layer and the ground conductor layer disposed on the same surface so as to surround the one end of the line conductor is coupled to the slot formed in the ground conductor layer to be substantially orthogonal to the one end of the line conductor, the high frequency line and the slot are formed on the same surface, and as a result, the relative positional relation of both is difficult to change, and variation in the length of a stub as a protruding portion of the high frequency line with respect to the slot can be made small, and accordingly, variation in the characteristic of electromagnetic coupling can be made small, and variation in the conversion characteristic of the high frequency line-to-waveguide conversion can be made small.

Besides, in the invention it is preferable that the shield conductor part includes a plurality of shield through conductors disposed in the inside of the dielectric layer.

According to the invention, when the shield conductor part includes the plurality of shield through conductors disposed in the inside of the dielectric layer, at the time of fabrication of the high frequency line-to-waveguide converter, the shield through conductors can be formed at the same time as the line conductor and the ground conductor layer, and the high frequency line-to-waveguide converter can be easily fabricated. Besides, since the shape of the region surrounded by the shield through conductors of the dielectric layer can be designed arbitrarily, for example, in the case where an unnecessary resonance occurs in the region surrounded by the shield through conductors of the dielectric layer, it becomes possible to shift the unnecessary resonance to the outside of the band of signal conversion by adjusting the arrangement of the shield conductor part.

Besides, in the invention it is preferable that a thickness of the dielectric layer is approximately $(2n-1)/4$ (n is a natural number) of a wavelength of a signal transmitted through the high frequency line.

According to the invention, when the thickness of the dielectric layer is approximately ¼ of the wavelength of the signal transmitted through the high frequency line, a distance from the slot to the boundary between the dielectric layer and the waveguide becomes approximately ¼ of the signal wavelength, an optical path difference between a reflected wave, which is radiated from the slot, is reflected at the boundary between the dielectric layer and the wave guide, is again reflected at the ground conductor layer in which the slot is formed, and is again returned to the boundary and a direct wave directly transmitted from the slot to the boundary becomes ½ of the signal wavelength, and the phase is inverted when the reflected wave is reflected at the ground conductor layer, and accordingly, the direct wave and the reflected wave come to have the same phase at the boundary to intensify each other, and the signal is efficiently transmitted to the waveguide. At this time, when the thickness of the dielectric layer is made (2n−1)/4 of the signal wavelength, where n is a natural number, the optical path difference between the reflected wave and the direct wave becomes (n−1)/2 of the signal wavelength, and since the optical path difference n times as long as the signal wavelength is equivalent to a case where there is no optical path difference, it substantially becomes ½ of the signal wavelength, and the same effect is obtained.

Besides, according to the invention, when the thickness of the dielectric layer is approximately (2n−1)/4 of the wavelength of the signal transmitted through the high frequency line, where n is a natural number, the distance from the slot to the boundary between the dielectric layer and the waveguide becomes approximately (2n−1)/4 of the signal wavelength, and since the length of the optical path in which the reflected wave reflected at the boundary between the dielectric layer and the waveguide is totally reflected at the ground conductor layer and is returned to the boundary becomes substantially ½ of the signal wavelength, the phase becomes inverted when the wave is returned, and in combination with the phase inversion by the total reflection at the ground conductor layer, the reflected wave comes to have the same phase as the direct wave directly transmitted from the slot to the boundary, and these are combined with each other and the signal is efficiently transmitted to the waveguide. Besides, in addition to that, the signal frequency becomes high, and the signal wavelength becomes short, and in the case where the strength of the dielectric layer is lowered when the thickness of the dielectric layer is set to ¼ of the signal wavelength, it becomes possible to suppress the lowering of the strength of the dielectric layer by setting the thickness of the dielectric layer to ¾, 5⁄4 or the like of the signal wavelength.

Besides, in the invention it is preferable that a tip of the one end of the line conductor is opened, and a distance between the tip and the slot is approximately (2n−1)/4 (n is a natural number) of the wavelength of the signal transmitted through the high frequency line.

According to the invention, when the tip of the one end of the line conductor is opened, and the distance between the tip and the slot is approximately ¼ of the wavelength of the signal transmitted through the high frequency line, the signal (traveling wave) transmitted through the high frequency line is totally reflected at the open end, and becomes a regressive wave transmitted in the opposite direction. At this time, since the tip is opened, a current can not flow in the tip, and the current of the regressive wave is reflected in this portion while the phase is inverted to cancel the current of the traveling wave. The synthesis of the current of the traveling wave and the currant of the regressive wave which inverts the phase produces a standing wave in which the open tip is a node and a node pitch is ½ of the signal wavelength. Here, since the distance between the open tip and the slot is ¼ of the signal wavelength, a portion of the high frequency line just above the slot becomes the antinode of the standing wave, the current becomes maximum, and the magnetic field generated by the current becomes maximum. The magnetic field which becomes maximum moves to the slot, excellent electromagnetic coupling is performed, and the signal is finally efficiently transmitted to the waveguide. At this time, when the distance between the open end and the slot is made (2n−1)/4 of the signal wavelength, where n is a natural number, the slot is positioned at the position of the antinode of the standing wave formed by synthesis of the traveling waves and the regressive wave, and the same effect as the case where the distance between the open end and the slot is ¼ of the signal wavelength is obtained.

Besides, according to the invention, when the tip of the high frequency line is opened, and the distance between the open tip and the slot is set to (2n−1)/4 of the signal wavelength, where n is a natural number, the standing wave formed by synthesis of the traveling wave transmitted through the high frequency line and the regressive wave reflected at the open tip can be made such that the magnetic field becomes highest at the portion of the slot, and the electromagnetic coupling from the high frequency line to the slot through the magnetic field is most excellently performed, and accordingly, the conversion efficiency of the high frequency line-to-waveguide conversion can be made high.

Besides, in the invention it is preferable that a tip of the one end of the line conductor is short-circuited to the ground conductor layer, and a distance between the tip and the slot is approximately (n−1)/2 (n is a natural number) of the wavelength of the signal transmitted through the high frequency line.

According to the invention, when the tip of the one end of the line conductor is short-circuited to the ground conductor layer, and the distance between the tip and the slot is approximately ½ of the wavelength of the signal transmitted through the high frequency line, the signal (traveling wave) transmitted through the high frequency line is totally reflected at the short-circuit end, and becomes the regressive wave transmitted in the opposite direction. At this time, since the tip is short-circuited, a maximum current flows in the tip part, and in this portion, the current of the regressive wave is reflected at the same phase as the current of the traveling wave. The synthesis of the current of the traveling wave and the current of the regressive wave which does not change the phase produces a standing wave in which the open tip is an antinode and an antinode pitch is ½ of the signal wavelength. Here, since the distance between the short-circuit tip and the slot is ½ of the signal wavelength, a portion of the high frequency line just above the slot becomes the antinode of the standing wave, the current becomes maximum, and the magnetic field generated by the current becomes maximum. The maximum magnetic field moves to the slot, excellent electromagnetic coupling is performed, and the signal is finally efficiently transmitted to the waveguide. At this time, when the distance between the short-circuit tip and the slot is made (n−1)/2 of the signal wavelength, where n is a natural number, the slot is positioned at the position of the antinode of the standing wave formed by synthesis of the traveling wave and the regressive wave, and the same effect as the case where the distance between the short-circuit tip and the slot is ½ of the signal wavelength is obtained.

Besides, according to the invention, when the tip of the high frequency line conductor is short-circuited by the ground conductor layer, and the distance between the short-circuited tip and the slot is set to (n−1)/2 of the signal wavelength, where n is a natural number, the standing wave formed by synthesis of the traveling wave transmitted through the high frequency line and the regressive wave reflected at the short-circuited tip can be made such that the magnetic field becomes highest at the portion of the slot, and the electromagnetic coupling from the high frequency line to the slot through the magnetic field is most excellently performed, and accordingly, the conversion efficiency of the high frequency line-to-waveguide conversion can be raised.

The invention provides a high frequency line-to-waveguide converter comprising:

a high frequency line including a dielectric layer, a line conductor disposed on one surface of the dielectric layer, and a same surface ground conductor layer disposed on the same surface so as to surround one end of the line conductor;

a slot formed in the same surface ground conductor layer so as to be substantially orthogonal to the one end of the line conductor and coupled to the high frequency line in terms of high frequency;

a shield conductor part disposed on a side of or in an inside of the dielectric layer so as to surround the one end of the line conductor and the slot;

a waveguide disposed on a side of the other surface of the dielectric layer so that an opening is opposite to the one end of the line conductor and the slot, and electrically connected to the shield conductor part; and an internal ground conductor layer disposed in the inside of the dielectric layer between the same surface ground conductor layer and the waveguide and having a transmission opening for causing an electromagnetic wave of a signal transmitted through the high frequency line to be transmitted between the slot and the waveguide.

According to the invention, in a portion of the dielectric layer surrounded by the same surface ground conductor layer disposed on the same surface so as to surround the line conductor disposed on the one surface of the dielectric layer and the one end of the line conductor, the shield conductor part disposed on the side of or in the inside of the dielectric layer so as to surround the slot, and the waveguide opening part at the side of the other surface of the dielectric layer, and in a portion along the waveguide opening having a highest magnetic field of a TM mode as a resonant mode, since the high frequency line part and the waveguide opening part are separated by the internal ground conductor layer, an electromagnetic mode transmitted from the high frequency line to the waveguide is not coupled with the TM mode as the resonant mode, and as a result, a signal energy transmitted through the high frequency line is not transferred to the resonant mode, and signal reflection by resonance is made to difficult to generate, so that excellent signal conversion from the high frequency line to the waveguide can be performed.

Besides, in the invention it is preferable a distance between the internal ground conductor layer and the opening of the waveguide is approximately (2n−1)/4 (n is a natural number) of a wavelength of an electromagnetic wave of a signal transmitted through the high frequency line.

According to the invention, when the distance between the internal ground conductor layer and the waveguide is approximately ¼ of the wavelength of the electromagnetic wave excited in the dielectric layer by the signal transmitted through the high frequency line, an optical path difference between a reflected wave, which is radiated from the slot, is reflected at the boundary between the dielectric layer and the waveguide, is again reflected at the internal ground conductor layer, and is again returned to the boundary between the dielectric layer and the waveguide, and a direct wave directly transmitted from the slot to the boundary between the dielectric layer and the waveguide becomes approximately ½ of the wavelength of the electromagnetic wave excited in the dielectric layer by the signal, and further, the phase of the magnetic field is inverted when the reflected wave is reflected at the boundary between the dielectric layer and the waveguide, and accordingly, the direct wave and the reflected wave have the same phase at the boundary between the dielectric layer and the waveguide to intensify each other, and the electromagnetic wave signal is efficiently transmitted to the waveguide. At this time, when the distance between the internal ground conductor layer and the waveguide is made approximately (2n−1)/4 of the wavelength of the electromagnetic wave excited in the dielectric layer by the signal, where n is a natural number, the optical path difference between the reflected wave and the direct wave becomes approximately (2n−1)/2 of the wavelength of the electromagnetic wave, and the same effect as the case where the optical path difference between the reflected wave and the direct wave is approximately ½ of the wavelength of the electromagnetic wave is obtained.

Besides, in the invention it is preferable that an area of the transmission opening is half or less of an area of a region surrounded by the shield conductor part.

According to the invention, the area of the transmission opening is the half or less of the area of the region surrounded by the shield conductor part, and as a result, the internal ground conductor layer occupies the half or more of the area surrounded by the shield conductor part, so that the half or more of the reflected wave radiated from the slot and reflected at the boundary between the dielectric layer and the waveguide is again reflected at the internal ground conductor layer, the reflected wave and the direct wave from the slot intensify each other, and the conversion efficiency of the high frequency line-to-waveguide conversion can be raised.

Besides, in the invention it is preferable that the shield conductor part includes a plurality of shield through conductors disposed in the inside of the dielectric layer.

According to the invention, the shield conductor part includes the plurality of shield through conductors disposed in the inside of the dielectric layer, and when the high frequency line-to-waveguide converter is fabricated, these through conductors can be formed at the same time as the line conductor, the ground conductor layer, and the internal ground conductor layer, and the high frequency line-to-waveguide converter can be easily fabricated.

Besides, in the invention it is preferable that a tip of the one end of the line conductor is opened, and a distance between the tip and the slot is approximately (2n−1)/4 (n is a natural number) of the wavelength of the signal transmitted through the high frequency line.

According to the invention, in the case where the tip of the high frequency line conductor is opened, and the distance between the open tip and the slot is approximately ¼ of the signal wavelength, an optical path length of the high frequency signal transmitted to the open tip from the slot, totally reflected at the open tip, and returned to the slot becomes approximately ½ of the signal wavelength, and the phase of the magnetic field is inverted by the total reflection at the open tip, and accordingly, the returned high frequency signal comes to have the same phase as the high frequency signal transmitted through the high frequency line, and they intensify each other, and are firmly coupled with the slot, and the conversion efficiency from the high frequency line to the waveguide can be raised. At this time, when the distance between the open tip and the slot is made approximately (2n−1)/4 of the signal wavelength, where n is a natural number, the optical path difference between the reflected wave and the direct wave becomes approximately (2n−1)/2 of the signal wavelength, and the same effect as the case where the optical path difference between the reflected wave and the direct wave is approximately ½ of the wavelength of the electromagnetic wave is obtained.

Besides, in the invention it is preferable that a tip of the one end part of the line conductor is short-circuited to the same surface ground conductor layer, and the distance between the tip and the slot is approximately (n−1)/2 (n is a natural number) of the wavelength of the signal transmitted through the high frequency line.

According to the invention, in the case where the tip of the line conductor of the high frequency line is short-circuited and the distance between the short-circuit tip and the slot becomes approximately ½ of the signal wavelength, an optical path length of the high frequency signal transmitted from the slot to the short-circuit tip, totally reflected at the short-circuit tip, and returned to the slot comes to have substantially the same length as the signal wavelength, and since the phase of the magnetic field is not changed in the total reflection at the short-circuit tip, the returned high frequency signal comes to have the same phase as the high frequency signal transmitted through the high frequency line, and they intensify each other and are firmly coupled with the slot, and the conversion efficiency from the high frequency line to waveguide can be raised. At this time, when the distance between the short-circuit tip and the slot is made approximately (n−1)/2 of the signal wavelength, where n is a natural number, the high frequency signal transmitted from the slot to the short-circuit tip, totally reflected at the short-circuit tip, and returned to the slot comes to have the same phase as the high frequency signal transmitted through the high frequency line, and they intensify each other and are firmly coupled with the slot, and the conversion efficiency from the high frequency line to the waveguide can be raised. Besides, in the case where n is 1, the line conductor is short circuited at the slot part, and since the reflection by the short circuit does not change the phase of the magnetic field, it comes to have the same phase as the high frequency signal transmitted through the high frequency line, and they intensify each other.

Besides, in the invention it is preferable that the same surface ground conductor layer and the internal ground conductor layer are connected by a connection conductor disposed to pass through the dielectric layer along the transmission opening.

According to the invention, the ground conductor layer of the high frequency line and the internal ground conductor layer are connected by the connection conductor along the transmission opening, and it becomes possible to effectively use a high frequency line portion outside of the region surrounded by the connection conductor, and as a result, a system using the high frequency line-to-waveguide converter can be miniaturized. In the invention, it is preferable that a second dielectric layer is laminated on the dielectric layer, and a one surface ground conductor layer is provided on one surface of the second dielectric layer so as to cover the line conductor, whereby a coplanar line structure having ground is achieved.

The invention provides a high frequency package, wherein a through hole is formed in a metal base having a mounting part of a high frequency electronic component on one surface, the through hole being disposed to be adjacent to the mounting part and having an opening connected with a waveguide on a side of another surface, a connection terminal part including a high frequency line conductor directed from an outer peripheral part to a center part on one surface of a dielectric substrate and a same surface ground conductor disposed to be close to the high frequency line conductor is formed on one side of the through hole, a frame ground conductor having a shape conforming to an opening of the through hole on the one side is formed on another surface of the dielectric substrate so as to be opposite to an end of the high frequency line conductor on a side of the center part, an internal ground conductor provided with a slot coupled with the end of the high frequency line conductor at the side of the center part in terms of high frequency is formed between the end of the high frequency line conductor at the side of the center part in the inside of the dielectric substrate and the frame ground conductor, and a conversion substrate in which the same surface ground conductor is connected to the internal ground conductor through a first connection conductor and the frame ground conductor is connected to the internal ground conductor through a second connection conductor, is jointed on the one side of the through hole such that the connection terminal part is positioned on a side of the mounting part and the frame ground conductor is made to conform to the opening of the through hole on the one side.

The invention provides a high frequency package comprising:

a metal base including a mounting part for a high frequency electronic component on one surface thereof, a through hole disposed to be adjacent to the mounting part and having an opening on another side thereof connected with a waveguide, being formed therein; and a conversion substrate, including:

a dielectric substrate, a connection terminal part, including a high frequency line conductor disposed so as to extend from an outer peripheral part toward a center part on one surface of the dielectric substrate, and a same surface ground conductor disposed to be close to the high frequency line conductor on the one surface of the dielectric substrate, a frame ground conductor formed on another surface of the dielectric substrate in a shape conforming to an opening on one side of the through hole so as to be opposite to an end of the high frequency line conductor on the center part side, an internal ground conductor formed in an inside of the dielectric substrate and between the end of the high frequency line conductor on the center part side and the frame ground conductor, the internal ground conductor being provided with a slot coupled to the end of the high frequency line conductor on the center part side in terms of high frequency, a first connection conductor for connecting the same surface ground conductor and the internal ground conductor, and a second connection conductor for connecting the frame ground conductor and the internal ground conductor, wherein the conversion substrate is jointed on the one side of the through hole of the metal base such that the connection terminal part is positioned on the side of the mounting part of the metal base and the frame ground conductor is made to conform to the opening on the one side of the through hole of the metal base.

According to the invention, since the connection terminal part is formed which is disposed to be adjacent to the mounting part of the high frequency electronic component and includes the high frequency line conductor directed from the outer peripheral part to the center part on the one surface of the dielectric substrate and the same surface ground conductor disposed to be close to the high frequency line conductor, when the high frequency line conductors of the conversion substrate and the high frequency electronic component and the same surface ground conductors of these are respectively connected to each other by wire bonding, the connection distance between the high frequency line conductors can be made substantially equal to the connection distance between the same surface ground conductors, and the high frequency package can be provided in which the phases of the high frequency signal and the ground potential at the connection part between the conversion substrate and the high frequency electronic component are not delayed and the signal transmission is excellent.

Besides, the invention provides a high frequency package, wherein a through hole is formed in a metal base having a mounting part of a high frequency electronic component on one surface, the through hole being disposed to be adjacent to the mounting part and having an opening connected with a waveguide on a side of another surface, a connection terminal part including a high frequency line conductor directed from an outer peripheral part to a center part on one surface of a dielectric substrate and a same surface ground conductor disposed on the same surface so as to surround an end of the high frequency line conductor on a side of the center part is formed on one side of the through hole, a frame ground conductor having a shape conforming to an opening of the through hole on the one side is formed on the other surface of the dielectric substrate so as to be opposite to the end of the high frequency line conductor at the side of the center part, a slot formed to be orthogonal to the end of the high frequency line conductor at the side of the center part and coupled to the high frequency line conductor in terms of high frequency is provided in the same surface ground conductor, and a conversion substrate in which the same surface ground conductor is connected to the frame ground conductor through a connection conductor is joined on the one side of the through hole such that the connection terminal part is positioned on a side of the mounting part and the frame ground conductor is made to conform to the opening of the through hole on the one side.

The invention provides a A high frequency package comprising:

a metal base a metal base having a mounting part of a high frequency electronic component on one surface, and a through hole disposed to be adjacent to the mounting part, an opening on one side of the through hole being connected with a waveguide; and a high frequency line-to-waveguide conversion substrate joined on an opening on another side of the through hole, the high frequency line-to-waveguide conversion substrate including:

a high frequency line including:

a dielectric substrate;

a high frequency line conductor directed from an outer peripheral part to a center part on one surface of the dielectric substrate; and a same surface ground conductor disposed on the same surface as the one surface of the dielectric substrate so as to surround an end of the high frequency line conductor on the center part side, a frame ground conductor formed on another surface of the dielectric substrate in a shape conforming to an opening on another side of the through hole so as to be opposite to the end of the high frequency line conductor on the center part side;

a slot provided on the same surface ground conductor and formed to be orthogonal to the end of the high frequency line conductor on the center part side and coupled to the high frequency line in terms of high frequency; and a connection conductor for connecting the same surface ground conductor and the frame ground conductors, wherein the high frequency line-to-waveguide conversion substrate is joined on the other side of the through hole such that the high frequency line is positioned on a side of the mounting part and the frame ground conductor is made to conform to the opening on the other side of the through hole.

The invention provides a high frequency package comprising:

a metal base including a mounting part for a high frequency electric component on one surface thereof, a through hole disposed to be adjacent to the mounting part and having the lower side opening connected with the waveguide, being formed therein; and a conversion substrate, including:

a dielectric substrate, a connection terminal part, including a high frequency line conductor formed on one surface of the dielectric substrate and disposed so as to extend from an outer peripheral part toward a center part on the one surface of the dielectric substrate, and a same surface ground conductor disposed on the same surface as the one surface of the dielectric substrate so as to surround an end of the high frequency line conductor on the center part side, the same surface ground conductor being provided with a slot formed to be orthogonal to the end of the high frequency line conductor on the center part side and coupled with the high frequency line conductor in terms of high frequency, a frame ground conductor formed on another surface of the dielectric substrate in a shape conforming to an opening on one side of the through hole so as to be opposite to the end of the high frequency line conductor on the center part side, and a connection conductor for connecting the same surface ground conductor and the frame ground conductors, wherein the conversion substrate is joined on the one side of the through hole of the metal base such that the connection terminal part is positioned on the side of the mounting part of the metal base and the frame ground conductor is made to conform to the opening on the one side of the through hole of the metal base.

The invention provides a high frequency package comprising:

a metal base including a mounting part for a high frequency electric component on one surface thereof, a through hole disposed to be adjacent to the mounting part and having an opening on one side connected with the waveguide, being formed therein; and a conversion substrate, including:

a high frequency line including:

a dielectric substrate;

a high frequency line conductor formed on one surface of the dielectric substrate and disposed so as to extend from an outer peripheral part toward a center part on the one surface of the dielectric substrate; and a same surface ground conductor disposed on the same surface as the one surface of the dielectric substrate so as to surround an end of the high frequency line conductor on the center part side, a frame ground conductor formed on another surface of the dielectric substrate in a shape conforming to an opening on another side of the through hole so as to be opposite to the end of the high frequency line conductor on the center part side;

a slot provided on the same surface ground conductor and formed to be orthogonal to the end of the high frequency line conductor on the center part side and coupled with the high frequency line conductor in terms of high frequency; and a connection conductor for connecting the same surface ground conductor and the frame ground conductors, wherein the conversion substrate is joined on the other side of the through hole of the metal base such that the high frequency line is positioned on the side of the mounting part of the metal base and the frame ground conductor is made to conform to the opening on the other side of the through hole of the metal base.

According to the invention, since the connection terminal part is formed which is disposed to be adjacent to the mounting part of the high frequency electronic component and includes the high frequency line conductor directed from the outer peripheral part to the center part on the one surface of the dielectric substrate and the same surface ground conductor disposed on the same surface so as to surround the end of the high frequency line conductor at the side of the center part, when the high frequency line conductors of the conversion substrate and the high frequency electronic component and the same surface ground conductors of these are respectively connected to each other by wire bonding, the connection distance between the high frequency line conductors can be made substantially equal to the connection distance between the same surface ground conductors, and the high frequency package can be provided in which the phases of the high frequency signal and the ground potential at the connection part between the conversion substrate and the high frequency electronic component are not delayed and the signal transmission is excellent.

Besides, the invention provides a high frequency package, wherein a through hole is formed in a metal base having a mounting part of a high frequency electronic component on one surface, the through hole being disposed to be adjacent to the mounting part and having an opening connected with a waveguide on a side of the other surface, a connection terminal part including a high frequency line conductor directed from an outer peripheral part to a center part on one surface of a dielectric substrate and a same surface ground conductor disposed on the same surface so as to surround an end of the high frequency line conductor on a side of the center part is formed on one side of the through hole, a frame ground conductor having a shape conforming to an opening of the through hole on the one side is formed on the other surface of the dielectric substrate so as to be opposite to the end of the high frequency line conductor at the side of the center part, a slot formed to be orthogonal to the end of the high frequency line conductor at the side of the center part and coupled with the high frequency line conductor in terms of high frequency is formed in the same surface ground conductor, an internal ground conductor provided with a transmission opening opposite to the slot and larger than the slot is formed between the high frequency line conductor in an inside of the dielectric substrate and the frame ground conductor, and a conversion substrate in which the same surface ground conductor is connected to the internal ground conductor through a first connection conductor and the frame ground conductor is connected to the internal ground conductor through a second connection conductor, is jointed on the one side of the through hole such that the connection terminal part is positioned on a side of the mounting part and the frame ground conductor is made to conform to the opening of the through hole on the one side.

The invention provides a high frequency package comprising:

a metal base a metal base having a mounting part of a high frequency electronic component on one surface, and a through hole disposed to be adjacent to the mounting part, an opening on one side of the through hole being connected with a waveguide; and a high frequency line-to-waveguide conversion substrate joined on an opening on another side of the through hole, the high frequency line-to-waveguide conversion substrate including:

a high frequency line including:

a dielectric substrate;

a high frequency line conductor directed from an outer peripheral part to a center part on one surface of a dielectric substrate; and a same surface ground conductor disposed on the same surface as the one surface of the dielectric substrate so as to surround an end of the high frequency line conductor on the center part side, a frame ground conductor formed on another surface of the dielectric substrate in a shape conforming to an opening on another side of the through hole so as to be opposite to the end of the high frequency line conductor on the center part side;

a slot provided on the same surface ground conductor and formed to be orthogonal to the end of the high frequency line conductor on the center part side and coupled to the high frequency line in terms of high frequency;

a internal ground conductor formed between the high frequency line conductor of an inside of the dielectric substrate and the frame ground conductor, and provided with the transmission opening opposite to the slot and larger than the slot;

a first connection conductor for connecting the same surface ground conductor and internal ground conductor; and a second connection conductor for connecting the frame ground conductor and the internal ground conductor, wherein the high frequency line-to-waveguide conversion substrate is jointed on the other side of the through hole such that the high frequency line is positioned on a side of the mounting part and the frame ground conductor is made to conform to the opening on the other side of the through hole.

The invention provides a high frequency package comprising:

a metal base including a mounting part for high a frequency electric component at one surface thereof, the through hole disposed to be adjacent to the mounting part and having an opening on another side thereof connected with the waveguide, being formed therein; and a conversion substrate including:

a dielectric substrate, a connection terminal part including a high frequency line conductor disposed so as to extend from an outer peripheral part toward a center part on one surface of the dielectric substrate, and a same surface ground conductor disposed on the same surface as the one surface of the dielectric substrate so as to surround an end of the high frequency line conductor on the center part side, the same surface ground conductor being provided with a slot formed to be orthogonal to the end of the high frequency line conductor on the center part side and coupled with the high frequency line conductor in terms of high frequency, a frame ground conductor formed on another surface of the dielectric substrate in a shape conforming to an opening on one side of the through hole so as to be opposite to the end of the high frequency line conductor on the center part side, a internal ground conductor formed between the high frequency line conductor of an inside of the dielectric substrate and the frame ground conductor, and provided with the transmission opening opposite to the slot and larger than the slot, a first connection conductor for connecting the same surface ground conductor and internal ground conductor, and a second connection conductor for connecting the frame ground conductor and the internal ground conductor, wherein the conversion substrate is joined on the one side of the through hole of the metal base such that the connection terminal part is positioned on the side of the mounting part of the metal base and the frame ground conductor is made to conform to the opening on the one side of the through hole of the metal base.

The invention provides a high frequency package comprising:

a metal base including a mounting part for high a frequency electric component at one surface thereof, the through hole disposed to be adjacent to the mounting part and having an opening on one side thereof connected with the waveguide, being formed therein; and a conversion substrate including:
a high frequency line including:
a dielectric substrate;
a high frequency line conductor disposed so as to extend from an outer peripheral part toward a center part on one surface of the dielectric substrate; and
a same surface ground conductor disposed on the same surface as the one surface of the dielectric substrate so as to surround an end of the high frequency line conductor on the center part side, a frame ground conductor formed on another surface of the dielectric substrate in a shape conforming to an opening on another side of the through hole so as to be opposite to the end of the high frequency line conductor on the center part side;

a slot provided on the same surface ground conductor and formed to be orthogonal to the end of the high frequency line conductor on the center part side and coupled with the high frequency line conductor in terms of high frequency;

a internal ground conductor formed between the high frequency line conductor of an inside of the dielectric substrate and the frame ground conductor, and provided with the transmission opening opposite to the slot and larger than the slot;

a first connection conductor for connecting the same surface ground conductor and internal ground conductor; and a second connection conductor for connecting the frame ground conductor and the internal ground conductor, wherein the conversion substrate is joined on the other side of the through hole of the metal base such that the high frequency line is positioned on the side of the mounting part of the metal base and the frame ground conductor is made to conform to the opening on the other side of the through hole of the metal base.

According to the invention, since the connection terminal part is formed which is disposed to be adjacent to the mounting part of the high frequency electronic component and includes the high frequency line conductor directed from the outer peripheral part to the center part on the one surface of the dielectric substrate and the same surface ground conductor disposed on the same surface so as to surround the end of the high frequency line conductor at the side of the center part, when the high frequency line conductors of the conversion substrate and the high frequency electronic component and the same surface ground conductors of these are respectively connected to each other by wire bonding, the connection distance between the high frequency line conductors can be made substantially equal to the connection distance between the same surface ground conductors, and the high frequency package can be provided in which the phases of the high frequency signal and the ground potential at the connection part between the conversion substrate and the high frequency electronic component are not delayed and the signal transmission is excellent.

Besides, in the invention it is preferable that an interval between the high frequency line conductor and the same surface ground conductor is ¼ or less of a signal wavelength of a high frequency signal transmitted through the high frequency line.

According to the invention, in the above structure, when the interval between the high frequency line conductor and the same surface ground conductor in ¼ or less of the signal wavelength of the high frequency signal transmitted through the high frequency line, in the case where the high frequency line conductors of the conversion substrate and the high frequency electronic component and the same surface ground conductors of these are respectively connected to each other by wire bonding, the distance between the wire for connecting the high frequency line conductors and the wire for connecting the same surface ground conductors can be made approximately ¼ or less of the signal wavelength of the high frequency signal, and the respective wires are electromagnetically coupled with each other to form the high frequency transmission path, and the high frequency package excellent in transmission of high frequency signals can be provided.

Besides, according to the invention, since the high frequency electronic component mounting part and the conversion substrate can be separated, the conversion substrate can be miniaturized, the stress due to difference in thermal expansion coefficient between the substrate and the metal base can be reduced, and the warp or crack of the package can be prevented.

Besides, according to the invention, the dielectric waveguide part surrounded by the internal ground conductor and the second connection conductor is shielded by the internal ground conductor from the high frequency electromagnetic field generated in the high frequency line conductor part of the one surface. For example, although the magnetic field circulating through the high frequency line conductor is generated in the high frequency line conductor part, part or the magnetic field is coincident with the magnetic field of the TM mode as one of resonant modes in the dielectric waveguide part, and these two magnetic fields are shielded by the internal ground conductor, so that a possibility to cause an unnecessary resonance in the dielectric waveguide part is reduced, and excellent conversion to the waveguide can be performed.

BRIEF DESCRIPTION OF THE DRAWINGS

Other and further objects, features, and advantages of the invention will be more explicit from the following detailed description taken with reference to the drawings wherein:

FIGS. 5A to 5C show an evaluation substrate of a high frequency line-to-waveguide converter of the invention, in which FIG. 5A is a top view, FIG. 5B is a sectional view taken along line V-V of FIG. 5A, and FIG. 5C is a bottom view.

FIGS. 8A to 8C are plan views showing a line conductor according to still another embodiment of the invention, in which FIG. 8A shows an example in which a tip of the line conductor is opened, FIG. 8B shows an example in which the tip of the line conductor is short-circuited, and FIG. 8C shows an example in which n is made 1 in FIG. 8B.

FIGS. 9A to 9C show an evaluation substrate of a high frequency line-to-waveguide converter of the invention, in which FIG. 9A is a top view, FIG. 9B is a sectional view taken along line VII-VII or FIG. 9A, and FIG. 9C is a bottom view.

FIGS. 10A and 10B are views showing a high frequency package according to still another embodiment of the invention, in which FIG. 10A is a plan view, and FIG. 10B is a sectional view taken along line VIII-VIII of FIG. 10A.

FIGS. 11A and 11B are views showing a high frequency package according to still another embodiment of the invention, in which FIG. 11A is a plan view, and FIG. 11B is a sectional view taken along line IX-IX of FIG. 11A.

FIGS. 12A and 12B are views showing a high frequency package according to still another embodiment of the invention, in which FIG. 12A is a plan view, and FIG. 12B is a sectional view taken along line X-X of FIG. 12A.

DETAILED DESCRIPTION OF THE PREFERRED EMBODIMENTS

Figure 1A:
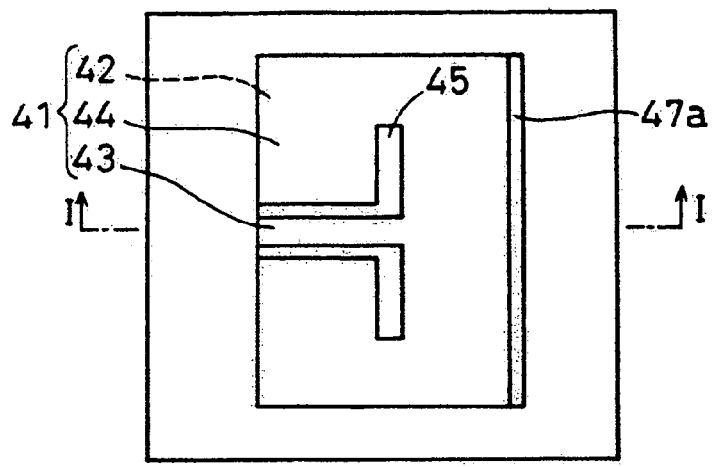
FIG. 1A is a plan view showing a high frequency line-to-waveguide converter according to one embodiment of the invention.

Now referring to the drawings, preferred embodiments of the invention are described below.

Figure 1B:
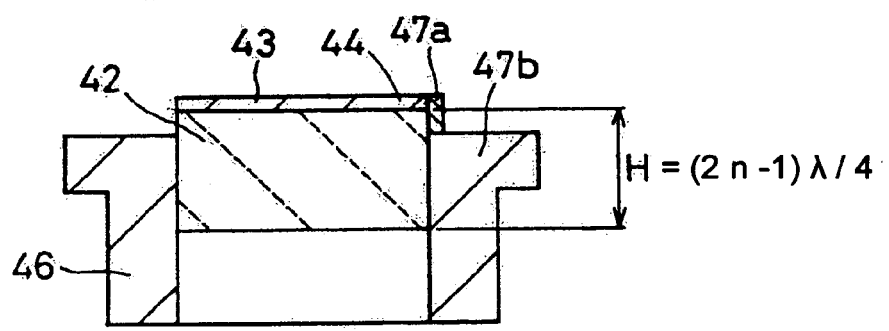
FIG. 1B is a sectional view taken along line I-I of FIG. 1A.
Figure 2A:
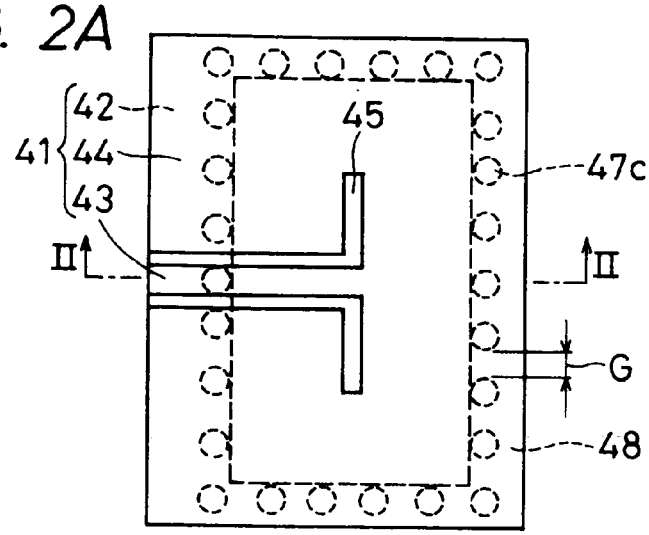
FIG. 2A is a plan view showing a high frequency line-to-waveguide converter according to another embodiment of the invention.
Figure 2B:
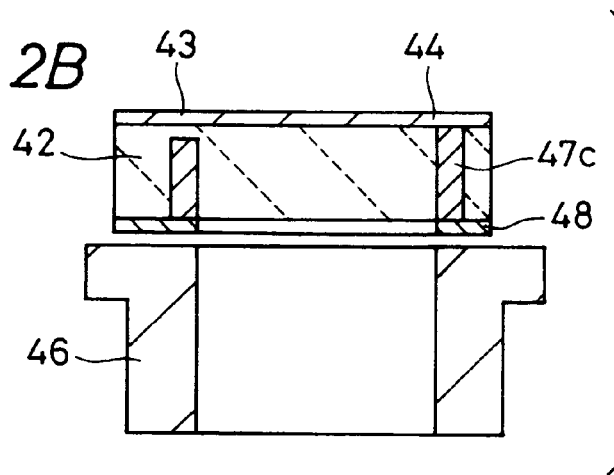
FIG. 2B is a sectional view taken along line II-II of FIG. 2A.

FIGS. 1A and 1B are views showing a high frequency line-to-waveguide converter according to still another embodiment of the invention, in which FIG. 1A is a plan view, and FIG. 1B is a sectional view taken along line I-I. Besides, FIGS. 2A and 2B are views showing a high frequency line-to-waveguide converter according to another embodiment of the invention, in which FIG. 2A is a plan view and FIG. 2B is a sectional view taken along line II-II. In FIGS. 1A and 1B and FIGS. 2A and 2B, reference numeral 41 denotes a high frequency line; reference numeral 42 denotes a dielectric layer; reference numeral 43 denotes a line conductor; reference numeral denotes 44 a ground conductor layer; reference numeral 45 denotes a slot formed in the ground conductor layer 44; reference numeral 46 denotes a waveguide; and reference numerals 47a, 47b and 47c denote shield conductor parts.

In the examples of the high frequency line-to-waveguide converter of the invention, a coplanar line as the high frequency line 41 is formed of the dielectric layer 42, the line conductor 43 disposed on the upper surface, as one surface, of the dielectric layer 42, and the ground conductor layer 44 disposed on the same surface (upper surface of the dielectric layer 42) so as to surround one end of the line conductor 43. Besides, the slot 45 formed to be substantially orthogonal to the one end of the line conductor 43 is disposed in the ground conductor layer 44 on the upper surface of the dielectric layer 42, and is electromagnetically coupled to the one end of the high frequency line 41. By this, a high frequency signal transmitted to the high frequency line 41 is radiated as an electromagnetic wave from the slot 45 into the waveguide 46 whose opening is positioned at the side of the lower surface, as another surface, of the dielectric layer 42 so as to be opposite to the one end of the line conductor 43 and the slot 45, and which is disposed to extend downward.

The side direction of the dielectric layer 42 is shielded by the shield conductor parts 47a, 47b and 47c disposed at the side of the dielectric layer 42 as shown in the example of FIGS. 1A and 1B or in the inside of the dielectric layer 42 as shown in the example of FIGS. 2A and 2B so as to surround the one end of the line conductor 43 and the slot 45, and the electromagnetic wave radiated from the slot 45 to the dielectric layer 42 and the electromagnetic wave reflected at the boundary between the dielectric layer 42 and the waveguide 46 are prevented from leaking out, and the conversion efficiency is prevented from lowering.

Since the line conductor 43 and the ground conductor layer 44 constituting the coplanar line as the high frequency line 41 and the slot 45 can be formed on the same surface by adopting the structure as stated above, as compared with the case where the line conductor 43 and the ground conductor layer 44, and the slot 45 are formed in different layers, a shift of relative position of both due to a lamination shift does not occur, and control of an electromagnetic coupling characteristic of the high frequency line 41 and the slot 45 becomes easy, and as a result, it becomes possible to perform a control so as to raise the conversion efficiency of the high frequency line-to-waveguide conversion, and a variation in conversion characteristic can be suppressed to be small.

Besides, since the high frequency line 41 is constituted by the line conductor 43 disposed on the upper surface of the dielectric layer 42 and the ground conductor layer 44, and the line conductor 43 and the ground conductor layer 44 constituting the high frequency line 41 and the slot 45 are disposed on the same surface of the upper surface of the dielectric layer 42, it is easy to check the relative position between the high frequency line 41 and the slot 45 from the outside after these are fabricated, and it is easy to feed back the relative position to a fabrication process so that the electromagnetic coupling characteristic between the high frequency line 41 and the slot 45 becomes excellent, or to improve fabrication yield through selection of poor products by check and to suppress the outflow of the poor products.

As a dielectric material forming the dielectric layer 42, aluminum oxide, aluminum nitride, silicon nitride, ceramic material containing mullite or the like as its main ingredient, glass, glass ceramic material formed by firing a mixture of glass and ceramic filler, epoxy resin, polyimide resin, organic resin material such as fluorine resin including tetrafluoroethylene resin, organic resin-ceramic (including glass) composite material or the like is used.

As a conductor material forming the line conductor 43, the ground conductor layer 44, the shield conductor part 47c of the through conductor or the like, a metalized material containing tungsten, molybdenum, gold, silver, copper or the like as its main ingredient, or a metal foil containing gold, silver, copper, aluminum or the like as its main ingredient is used.

Especially in the case where the high frequency line-to-waveguide converter is incorporated in a wiring substrate on which a high frequency component is mounted, as a dielectric material forming the dielectric layer 42, it is desirable that a dielectric loss tangent is small, and airtight sealing is possible. As an especially desirable dielectric material, at least one kind of inorganic material selected from a group consisting of aluminum oxide, aluminum nitride, and glass ceramic material can be mentioned. When such a hard material is used, the dielectric loss tangent is small and the mounted high frequency component can be airtightly sealed, so that such a material is preferable in raising the reliability of the mounted high frequency component. In this case, as a conductor material, it is desirable in view of airtightness and productivity to use a metalized conductor which can be fired at the same time as the dielectric material.

The high frequency line-to-waveguide converter of the invention is fabricated as described below. For example, in the case where an aluminum oxide sintered body is used as the dielectric material, first, a suitable organic solvent is added to and mixed with a raw material powder of aluminum oxide, silicon oxide, magnesium oxide, calcium oxide or the like to form slurry, and this is formed into a sheet by a well-known doctor blade method or a calendar roll method to fabricate a ceramic green sheet. Besides, a suitable organic solvent is added to and mixed with a raw material powder of high melting metal, such as tungsten or molybdenum, aluminum oxide, silicon oxide, magnesium oxide, calcium oxide or the like to fabricate a metallization paste. Next, through holes for formation of through conductors as the shield conductor part 47c are formed in the ceramic green sheet by, for example, a punching method, and the metallization paste is implanted in the through holes by, for example, a printing method, and subsequently, the metallization paste is printed to have the shape of the ground conductor 44 having the line conductor 43 and the slot 45. In the case where the dielectric layer 42 is made of a laminate structure having a plurality of dielectric layers, ceramic green sheets in which these conductors are implanted and printed are laminated, are pressurized to be subjected to pressure bonding, and are fired at a high temperature (about 1600° C.). Further, the surface of the conductor exposed on the surface of the line conductor 43, the ground conductor 44 or the like is plated with nickel and gold.

The shield conductor parts 47a, 47b and 47c are disposed on the side of or in the inside of the dielectric layer 42 so as to surround the one end of the line conductor 43 and the slot 45, and are electrically connected to the ground conductor layer 44 to be grounded.

FIGS. 1A and 1B shows the example in which the shield conductor parts 47a and 47b are disposed on the side of the dielectric layer 42, and a tube wall of an end of the waveguide 46 serves also as the shield conductor part 47b. The shield conductor parts 47a and 47b in this case may be metallized layers formed on the side of the dielectric layer 42, and the metallized layers on the side at that time have only to be formed so as to be electrically connected to the waveguide 46. With respect to the connection of the waveguide 46 to the metallized layers on the side in this case, although the connection may be performed such that the opening of the waveguide 46 is positioned at the lower surface of the dielectric layer 42, in order to suppress the leakage of an electromagnetic wave, as shown in FIGS. 1A and 1B, it is desirable that the waveguide 46 is set so that the lower surface of the dielectric layer 42 is positioned inside of the opening of the waveguide 46. Besides, the formation of the metalized layers onto the side of the dielectric layer 42 may be performed by a method in which in the foregoing fabrication method, after the ceramic green sheet is subjected to pressure bonding, the metallization paste is applied by printing to a portion of the side of the laminate body which becomes the dielectric layer 42, or a method in which after the side of the dielectric layer 42 is polished as the need arises after firing, the metallization paste is applied to the side by printing and is fired.

As shown in FIGS. 2A and 2B, it is appropriate that the shield conductor part 47c is constituted by a plurality of shield through conductors disposed in the inside of the dielectric layer 42. In the example shown in FIGS. 2A and 2B, the plurality of shield through conductors are arranged in the dielectric layer 42 so as to surround the one end of the line conductor 43 and the slot 45 and form the shield conductor part 47c. At this time, it is desirable that the shield through conductors are set to be positioned inside of the opening of the waveguide 46 so that unnecessary resonance does not occur. As stated above, when the shield conductor part 47c is formed of the plurality of shield through conductors, at the time of fabrication thereof, they can be formed in the dielectric layer 42 at the same time as the line conductor 43 on the upper surface and the ground conductor layer 44. Accordingly, it becomes possible to omit a step of separately forming the shield conductor part 47c on the side of the dielectric layer 42, and contrary to the case of the example shown in FIGS. 1A and 1B, it is not necessary to adjust the outer shape of the dielectric layer 42 so as to put the dielectric layer in the opening of the waveguide 46, and the high frequency line-to-waveguide converter can be easily fabricated. Besides, since the shape of the region of the dielectric layer 42 surrounded by the shield conductor part 47c can be arbitrarily designed, for example, in the case where unnecessary resonance occurs in the region of the dielectric layer 42 surrounded by the shield conductor part 47c, the arrangement of the shield conductor part 47c is adjusted, and it becomes possible to shift the unnecessary resonance to the outside of the band of signal conversion.

It is desirable that a gap (indicated by G in FIG. 2A) between the shield through conductors is made less than ¼ of the signal wavelength. This is because when the gap is made less than ¼ of the signal wavelength, the electromagnetic wave becomes difficult to leak from the gap between the shield through conductors, and the shield effect can be enhanced.

Incidentally, the shield through conductor constituting the shield conductor part 47c may be a so-called through hole conductor in which an inner wall of the through hole is coated with a conductor layer, or may be a so-called via conductor in which the inside of the through hole is filled with a conductor.

In order to enhance the conversion efficiency of the high frequency line-to-waveguide converter, it is preferable that the thickness (indicated by H in FIG. 1B) of the dielectric layer 42 is made approximately ¼ of the wavelength of a signal transmitted through the high frequency line 41. When the thickness of the dielectric layer 42 is made approximately ¼ of the wavelength of the signal, the distance from the slot 45 to the boundary between the dielectric layer 42 and the waveguide 46 becomes approximately ¼ of the signal wavelength, and the optical path length in which the reflected wave reflected at the boundary between the dielectric layer 42 and the waveguide 46 is totally reflected at the ground conductor layer 44 and is returned to the boundary becomes approximately ½ of the signal wavelength. Accordingly, when the reflected wave is returned, the phase is inverted, and in combination with the phase inversion by the total reflection at the ground conductor layer 44, the reflected wave comes to have the same phase as the direct wave directly transmitted to the boundary from the slot 45, and these are combined with each other, and the signal is efficiently transmitted to the waveguide 46. Incidentally, when the thickness of the dielectric layer 42 is made (2n−1)/4 of the signal wavelength, where n is a natural number, the optical path difference between the reflected wave and the direct wave becomes substantially ½ of the signal wavelength, and the same effect as the above can be obtained. Together with that, the signal frequency becomes high, and the signal wavelength becomes short, and when the thickness of the dielectric layer 42 is set to ¼ of the signal wavelength, in the case where the strength of the dielectric layer 42 is lowered, it is possible to suppress the lowering of the strength of the dielectric layer 42 by setting the thickness of the dielectric layer 42 to ¾, 5/4 or the like of the signal wavelength.

The thickness of the dielectric layer 42 can be adjusted in the foregoing fabrication method by adjusting the thickness of the ceramic green sheet which becomes the dielectric layer 42 after firing. In this case, the adjustment may be made by the thickness of one ceramic green sheet, or the adjustment may be made by laminating a plurality of ceramic green sheets.

Figure 3A:
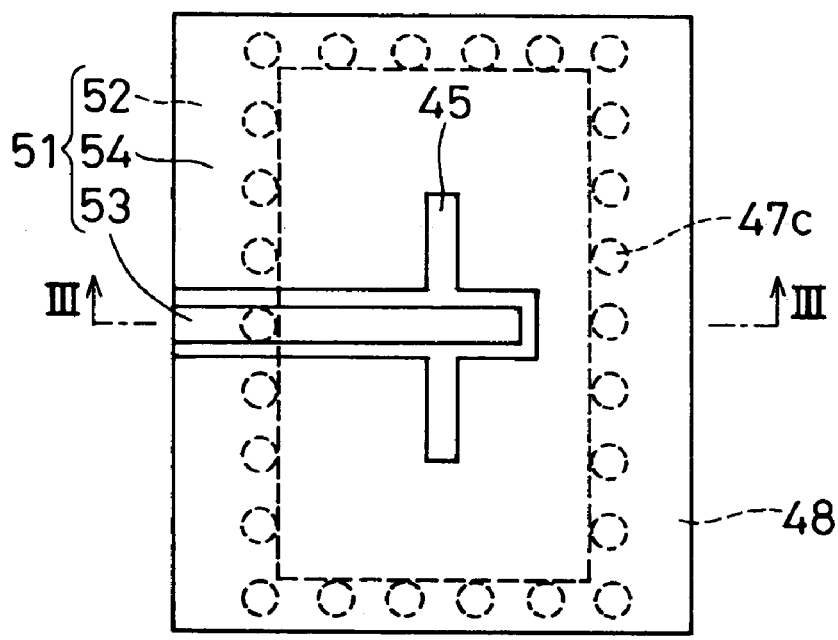
FIG. 3A is a plan view showing a high frequency line-to-waveguide converter according to still another embodiment of the invention.
Figure 3B:
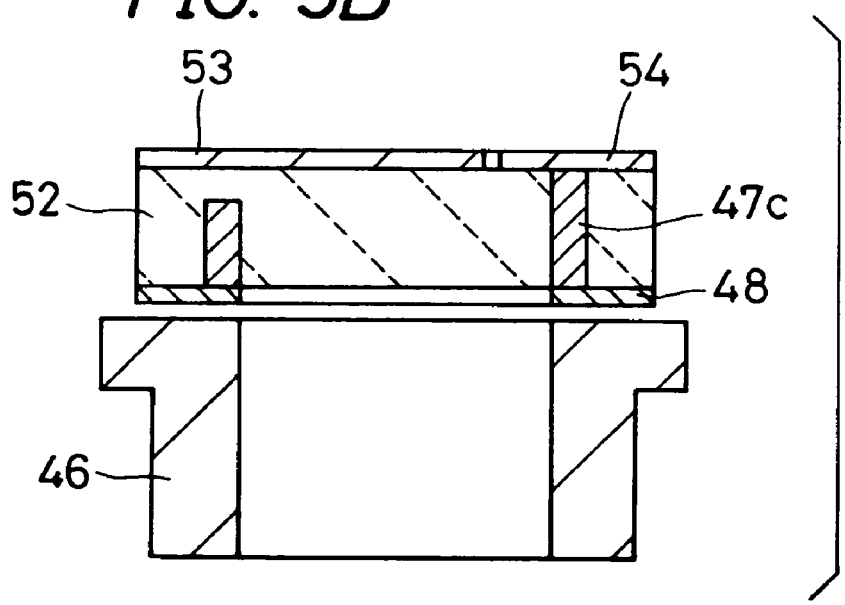
FIG. 3B is a sectional view taken along line III-III in FIG. 3A.

Next, FIGS. 3A and 3B are views showing a high frequency line-to-waveguide converter according to still another embodiment of the invention, in which FIG. 3A is a plan view, and FIG. 3B is a sectional view taken along line III-III. In FIGS. 3A and 3B, reference numeral 51 denotes a coplanar line as a high frequency line; reference numeral 52 denotes a dielectric layer; reference numeral 53 denotes a line conductor; reference numeral 54 denotes a ground conductor layer; reference numeral 55 denotes a slot formed in the ground conductor layer 54; reference numeral 46 denotes a waveguide; and reference numeral 47c denotes a shield conductor part. In this embodiment, the coplanar line as the high frequency line 51 includes the dielectric layer 52, the line conductor 53 disposed on a surface of the dielectric layer 52 and the ground conductor layer 54 disposed on the same place surrounding one end of the line conductor 53.

In the example of the high frequency line-to-waveguide converter of this invention, a tip of the line conductor 53 of the coplanar line as the high frequency line 51 is opened, namely, apart from the ground conductor layer 54, and a distance from the opened tip of the line conductor 53 to the center of the slot 55 is set to (2n−1)/4 of the signal wavelength, where n is a natural number. By this, in a standing wave formed by synthesis of a traveling wave transmitted through the coplanar line and a regressive wave reflected at the opened tip, a magnetic field becomes highest at a portion of the slot 45, so that electromagnetic coupling from the coplanar line to the slot 45 through the magnetic field is most excellently performed, and the conversion efficiency of the high frequency line-to-waveguide conversion can be enhanced.

Figure 4A:
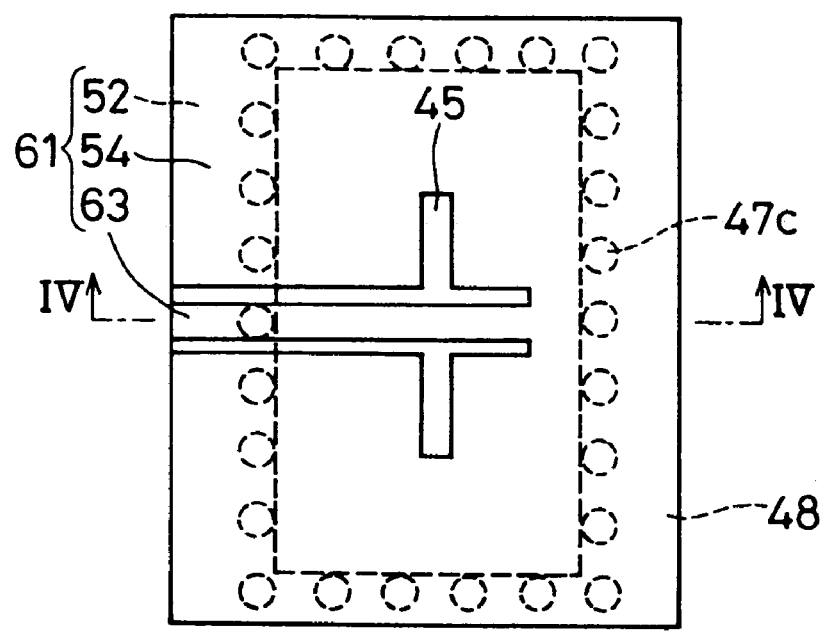
FIG. 4A is a plan view showing a high frequency line-to-waveguide converter according to still another embodiment of the invention.
Figure 4B:
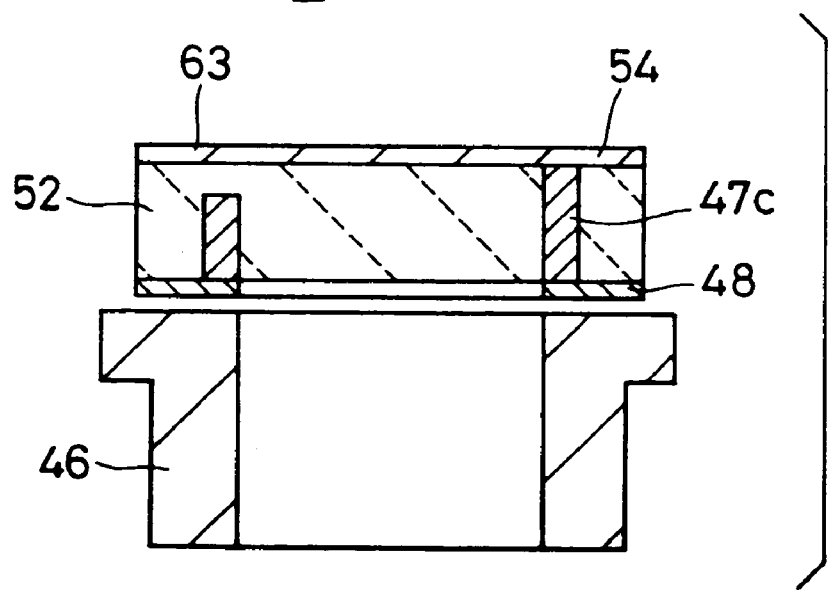
FIG. 4B is a sectional view taken along line IV-IV of FIG. 4A.

Next, FIGS. 4A and 4B are views showing a high frequency line-to-waveguide converter according to still another embodiment of the invention, in which FIG. 4A is a plan view, and FIG. 4B is a sectional view taken along line IV-IV. In FIGS. 4A and 4B, reference numeral 61 denotes a coplanar line as a high frequency line; reference numeral 52 denotes a dielectric layer; reference numeral 63 denotes a line conductor; reference numeral 54 denotes a ground conductor layer; reference numeral 45 denotes a slot formed in the ground conductor layer 54; reference numeral 46 denotes a waveguide; and reference numeral 47c denotes a shield conductor part. In this embodiment, a coplanar line as the high frequency line 61 includes the dielectric layer 52, the line conductor 63 disposed at the upper surface of the dielectric layer 52 and the ground conductor layer 54 disposed on the same surface surrounding one end of the line conductor 63.

In the example of the high frequency line-to-waveguide converter of the invention, a tip of the line conductor 63 of the coplanar line as the high frequency line 61 is short-circuited to the ground conductor layer 54, and a distance from the short-circuited tip to the center of the slot 45 is set to (n−1)/2 of a signal wavelength, where n is a natural number. By this, in a standing wave formed by synthesis of a traveling wave transmitted through the coplanar line and a regressive wave reflected at the short-circuited tip, a magnetic field becomes highest at a portion of the slot 45, and electromagnetic coupling from the coplanar line to the slot 45 through the magnetic field is performed most excellently, and the conversion efficiency of the high frequency line-to-waveguide conversion can be enhanced. Incidentally, the examples shown in FIGS. 1A and 1B and FIGS. 2A and 2B correspond to the case where n is made 1 in this example.

The shape of the waveguide 46 is not particularly restricted, and for example, when a WR series normalized as a rectangular waveguide is used, since a measuring correction kit is substantial, various characteristic evaluations become easy. However, for miniaturization and reduction in weight of a system according to the frequency of a high frequency signal to be used, a miniaturized rectangular waveguide may be used within the range where cutoff of the waveguide does not occur. Besides, a circular waveguide may be used.

The waveguide 46 is formed of metal, and it is appropriate that the wall in the tube is coated with novel metal, such as gold or silver, in order to reduce a conductor loss due to current or to prevent corrosion. Besides, resin is molded into a necessary waveguide shape, and similarly to the case of metal, the wall in the tube may be coated with novel metal such as gold or silver. The attachment of the waveguide 46 to the high frequency line-to-waveguide converter is performed by joining with solder material, screwing or the like.

In order to attach the waveguide 46 to the high frequency line-to-waveguide converter by joining with solder material, it is appropriate that a waveguide connecting conductor electrically connected to the ground conductor layer 54 and the shield conductor part 47c is previously formed to conform to the opening of the waveguide 46 to be attached. For example, as shown in FIGS. 2A and 2D, it is appropriate that a waveguide connecting conductor 48 made of a metallized layer connected to the shield conductor part 47c made of the shield through conductor is previously formed on the lower surface of the dielectric layer 42. Besides, also in the case where the shield conductor part is a metallized layer formed on the side of the dielectric layer 42, it is appropriate that the waveguide connecting conductor 48 made of a metallized layer is formed on the lower surface of the dielectric layer 42 so as to be connected to the metallized layer as the shield conductor part on the side. When the waveguide connecting conductor 48 as stated above is previously formed, the electrical connection between the waveguide 46 and the shield conductor and the ground conductor layer 44 at the time when the waveguide 46 is attached to the high frequency line-to-waveguide converter becomes more certain, and accordingly, this becomes preferable in that the high frequency line-to-waveguide converter having high reliability can be constructed.

The waveguide connection conductor 48 may be simultaneously formed, in the foregoing fabrication method, by printing metallization paste into the shape of the waveguide connection conductor 48 similarly to the formation of the line conductor 43,53,63, the ground conductor layer 44,54. Further, similarly to the conductor exposed on the surface, such as the line conductor 43,53,63 and the ground conductor layer 44,54, when the surface is plated with nickel and gold, the wettability of the solder material in the case of the joining with the solder material is improved, and according, this is more desirable.

Figure 1C:
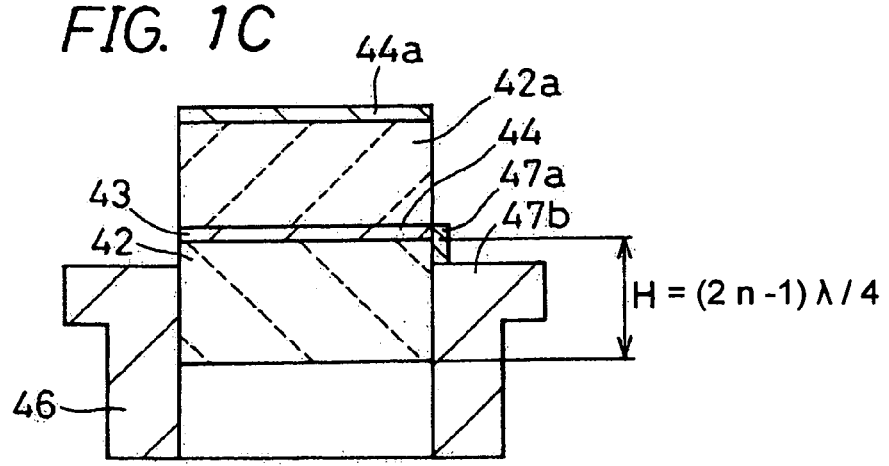
FIG. 1C is a sectional view showing a variation of a high frequency line-to-waveguide converter according to one embodiment of the invention.
Figure 2C:
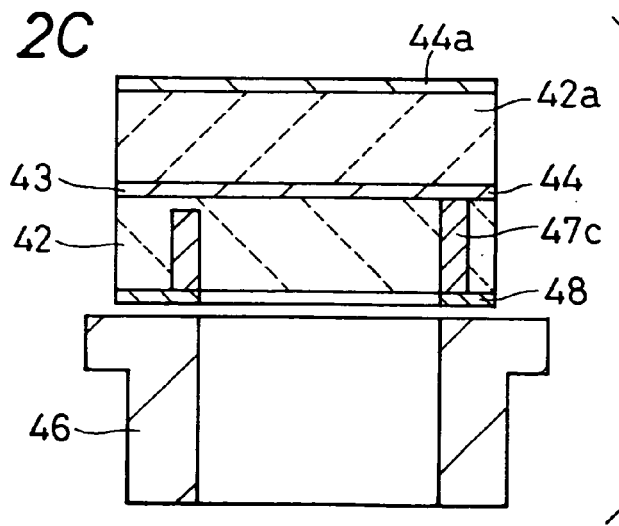
FIG. 2C is a sectional view showing a variation of a high frequency line-to-waveguide converter according to another embodiment of the invention.

For example, although FIGS. 1A and 1B and FIGS. 2A and 2B show the examples in which the high frequency line has the coplanar line structure, a coplanar line structure having a ground may be adopted in which a lower ground layer is provided between the line conductor 43,53,63 and the waveguide 46, or a coplanar line structure having ground may be adopted in which a dielectric layer 42a is further laminated on the dielectric layer 42, and an upper ground conductor layer 44a is provided on the upper surface of the dielectric layer 42a so as to cover the line conductor 43, as shown in FIGS. 1C and 2C. In any case, when the positional relation among the dielectric layer 42,52, the line conductor 43,53,63, the ground conductor layer 44,54, the slot 45, the waveguide 46 and the shield part 47a, 47b, 47c is made the same as the example shown in FIGS. 1A and 1B or FIGS. 2A and 2B, the same effect can be obtained.

Besides, in the foregoing example of the embodiment, although the description has been given of the fabrication method of the case where the aluminum oxide sintered body is used as the dielectric material, in the case where a glass ceramic sintered body is used as the dielectric material, in the foregoing fabrication method, as a raw material powder of a ceramic green sheet, a powder of a glass ceramic component is used, and as a raw material powder of metallization paste, in addition to the use of low melting metal such as silver, copper or gold, when a green sheet of an inorganic component which is not substantially sintered and shrunk at a temperature at which the glass ceramic material is sintered, for example, alumina is laminated on both surfaces of a laminate and is fired, firing shrinkage in an X-Y plane direction can be suppressed, so that it becomes possible to suppress variation in size of a ceramic wiring substrate due to variation in firing shrinkage, and the high frequency line-to-waveguide converter which further suppresses variation in size of a slot and in length of a stub can be obtained, which is advantageous.

EXAMPLE

Next, in order to confirm the effect of the high frequency line-to-waveguide converter of the invention, an experiment as described below was carried out.

Figure 5A:
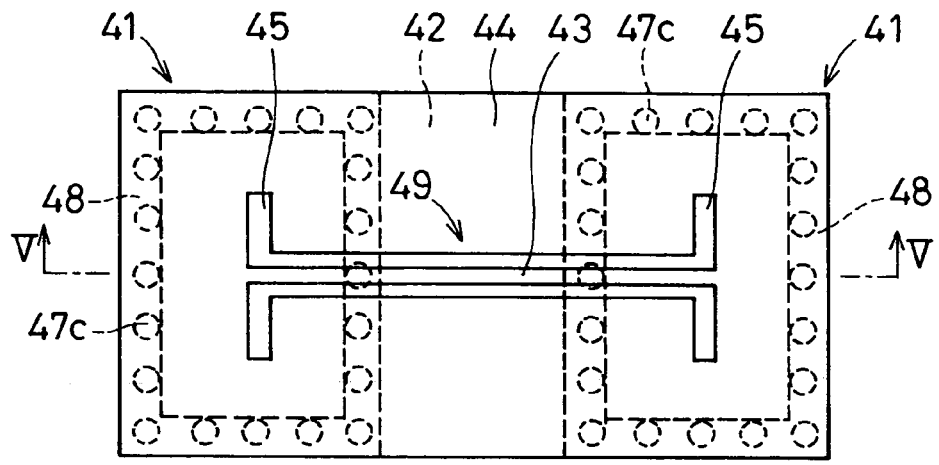
Figure 5B:
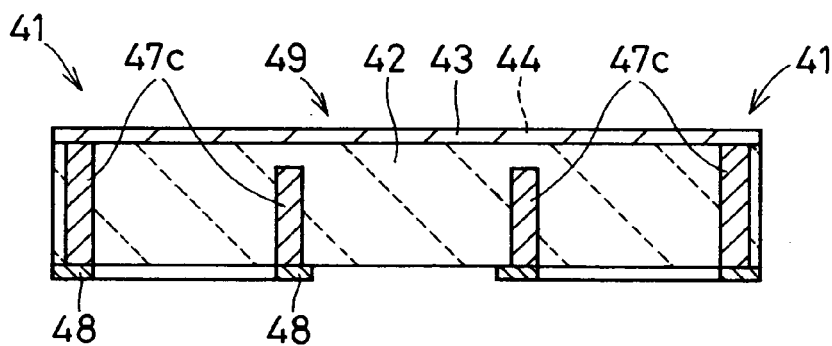
Figure 5C:
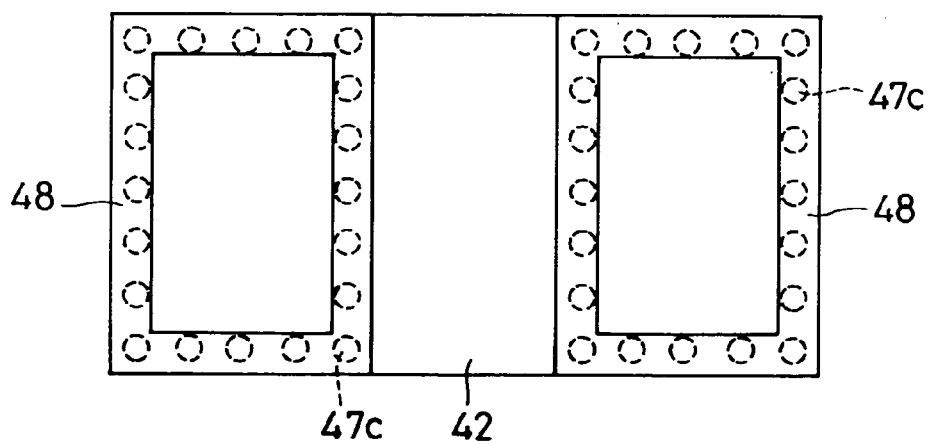

First, by using a ceramic green sheet of alumina ceramic whose dielectric lose tangent at 10 GHz became 0.0006 after firing and a metallization paste for tungsten metallization, an evaluation substrate as shown in FIGS. 5A to 5C was fabricated by a normal green sheet lamination technique and a simultaneous firing technique. Incidentally, FIG. 5A is top view of the evaluation substrate, FIG. 5B is a sectional view taken along line V-V of FIG. 5A, and FIG. 5C is a bottom view.

After firing, the surfaces of respective metallized layers of the upper surface and the lower surface of the evaluation substrate were subjected to plating with nickel and gold. Here, with respect to the high frequency line-to-waveguide converter in the evaluation substrate, the corresponding waveguide was set to a WR-10 for a W band (75 GHz to 110 GHz), and was designed while 76 GHz was made the center frequency. The evaluation substrate includes two high frequency line-to-waveguide converters of the invention at both sides in the drawing, each including the dielectric layer 42, the line conductor 43, the ground conductor layer 44, the slot 45, the shield conductor part 47c made of the shield through conductors, and the waveguide connection conductor 48 as shown in FIGS. 2A and 2B, and these two converters have such a structure that the line conductors 43, the ground conductor layers 44 of both are respectively, integrated. The integrated line conductor 43 and ground conductor layer 44, together with the dielectric layer 42, constitute the connection coplanar line 49. The interval between the high frequency line-to-waveguide converters at both sides was made 20 mm so that measuring waveguides could be respectively connected. By this, the evaluation substrate has such a structure that the two high frequency line-to-waveguide converters are connected by the connection coplanar line 49 having a length at 20 mm.

Next, an insertion loss within the range of 75 GHZ to 110 GHz was measured by a method in which a waveguide opening of a measuring waveguide was made to conform to the waveguide connecting conductor 48 of each of the high frequency line-to-waveguide converters of this evaluation substrate and was connected by screwing, a signal was inputted from one of the waveguides, and the signal outputted from the other of the waveguides was measured. From the result and the separately measured loss of the connecting coplanar line 49, the conversion loss of the high frequency line-to-waveguide converter was estimated.

As a result, the conversion loss at 76 GHz was about 0.7 dB, and it was confirmed that the conversion loss was sufficiently small in fabrication of a practical high frequency module.

Now referring to the drawings, preferred embodiments of the invention are described below.

Figure 6A:
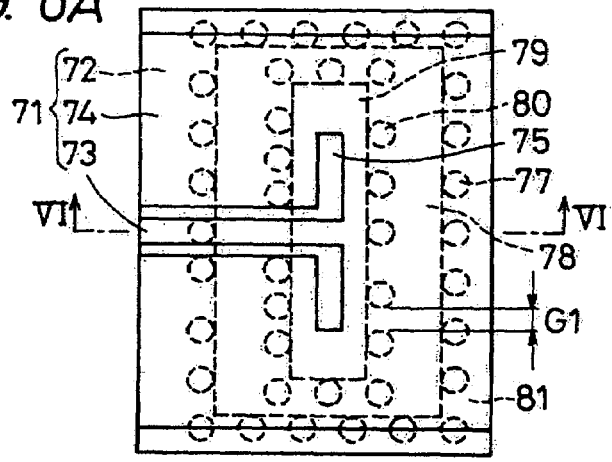
FIG. 6A is a plan view showing a high frequency line-to-waveguide converter according to still another embodiment of the invention.
Figure 6B:
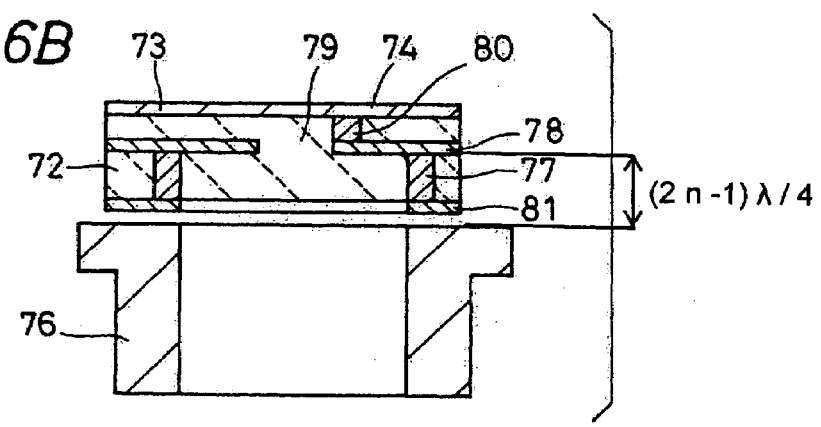
FIG. 6B is a sectional view taken along line VI-VI of FIG. 6A.

FIGS. 6A and 6B are views showing a high frequency line-to-waveguide converter according to still another embodiment of the invention, in which FIG. 6A is a plan view, and FIG. 6B is a sectional view taken along line VI-VI.

Figure 7A:
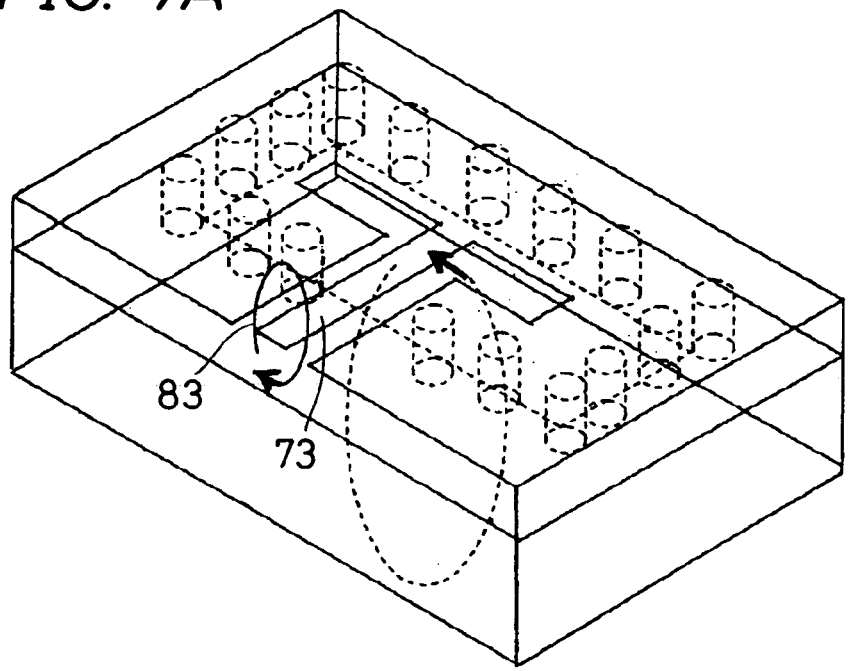
FIG. 7A is a perspective view of a case where a TE mode occurs in a dielectric layer in the example shown in FIGS. 6A and 6B.
Figure 7B:
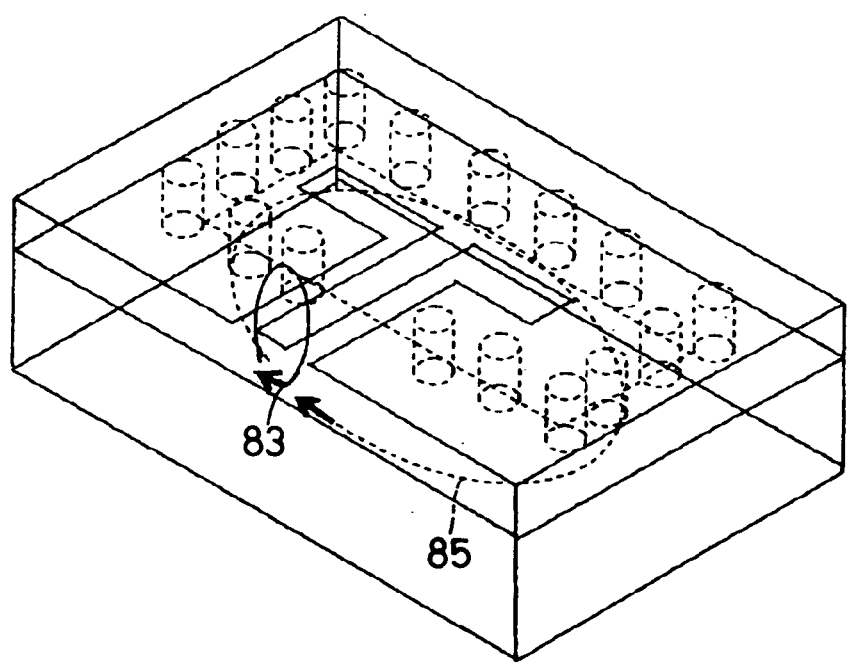
FIG. 7B is a perspective view of a case where a TM mode occurs in the dielectric layer.

FIGS. 7A and 7B are views showing modes in the respective parts in the example shown in FIG. 6A, in which FIG. 7A shows a case where a TE mode occurs in a dielectric layer and conversion is excellently performed, and FIG. 7B shows a case where a TM mode occurs in the dielectric layer and a signal is reflected. In FIGS. 6A and 6B and FIGS. 7A and 7B, reference numeral 71 denotes a coplanar line as a high frequency line; reference numeral 72 denotes a dielectric layer; reference numeral 73 denotes a line conductor; reference numeral 74 denotes a ground conductor layer; reference numeral 75 denotes a slot formed in the ground conductor layer 74; reference numeral 76 denotes a waveguide; reference numeral 77 denotes a shield conductor part; reference numeral 78 denotes an internal ground conductor layer; reference numeral 79 denotes a transmission opening formed in the internal ground conductor layer; and reference numeral 80 denotes a connection conductor for connecting the ground conductor layer 74 and the internal ground conductor layer 78.

In the example of the high frequency line-to-waveguide converter of the invention, the coplanar line as the high frequency line 71 is formed of the dielectric layer 72, the line conductor 73 disposed on the upper surface of the dielectric layer 72, and the ground conductor layer 74. Besides, the slot 75 is disposed in the ground conductor layer 74 on the upper surface of the dielectric layer 72, and is coupled with one end of the high frequency line 71 in terms of high frequency. By this, a high frequency signal transmitted to the high frequency line 71 is radiated as an electromagnetic wave from the slot 75 into the waveguide 76 disposed so as to extend downward. The side direction of the dielectric layer 72 is shielded by a conductor formed on the side or the shield conductor part 77 disposed in the inside as shown in FIGS. 6A and 6B, and this prevents the electromagnetic wave radiated from the slot 75 to the dielectric layer 72 and the electromagnetic wave reflected at the boundary between the dielectric layer 72 and the waveguide 76 from leaking out, and prevents the conversion efficiency from lowering. Besides, the internal ground conductor layer 78 is disposed between the ground conductor layer 74 and the waveguide 76, and the ground conductor layer 74 and the internal ground conductor layer 78 are connected by the connection conductor 80.

By adopting the structure as stated above, as shown in FIG. 7B, portions where a magnetic field distribution 83 of the coplanar line as the high frequency line 71 and a magnetic field distribution 85 of an unnecessary mode in the dielectric layer exist, are separated by the internal ground conductor layer 78 from the side of the dielectric layer 72 where the waveguide 76 is attached, and the occurrence of the unnecessary mode in the portion of the internal ground conductor layer 70 at the side of the waveguide 76 is suppressed, and as a result, it is possible to suppress the occurrence of reflection due to the resonance of the unnecessary mode in the high frequency line-to-waveguide conversion.

Besides, when the distance between the internal ground conductor layer 78 and the waveguide 76 is made approximately (2n−1)/4 (n is a natural number) of the wavelength of the electromagnetic wave excited in the dielectric layer 72 by the signal transmitted through the high frequency line 71, an optical path difference between a reflected wave, which is radiated from the slot 75, is reflected at the boundary between the dielectric layer 72 and the waveguide 76, is again reflected at the internal ground conductor layer 78, and is again returned to the boundary between the dielectric layer 72 and the waveguide 76 and a direct wave directly transmitted from the slot 75 to the boundary between the dielectric layer 72 and the waveguide 76 becomes the sum of approximately ½ of the wavelength of the electromagnetic wave and an integral multiple of the wavelength of the electromagnetic wave, and when the reflected wave is reflected at the boundary between the dielectric layer 72 and the waveguide 76, the phase of the magnetic field is inverted, and accordingly, at the boundary between the dielectric layer 72 and the waveguide 76, the direct wave and the reflected wave come to have the same phase and intensify each other, and the signal is efficiently transmitted to the waveguide.

Besides, when the area of the transmission opening 79 is made the half or less of the area of the region surrounded by the shield conductor part 77, the internal ground conductor layer 78 occupies the half or more of the area of the region surrounded by the shield conductor part 77, the half or more of the reflected wave radiated from the slot 75 and reflected at the boundary between the dielectric layer 72 and the waveguide 76 is again reflected at the internal ground conductor layer 78, and this reflected wave and the direct wave from the slot 75 come to have the same phase and intensify each other, and eventually, the transmission opening 79 enhances the conversion efficiency of the high frequency line-to-waveguide converter.

Besides, when the shield conductor part 77 is constituted by the plurality of through conductors, at the time of fabrication of the high frequency line-to-waveguide converter, it becomes possible to form the through conductors at the same time as the line conductor 73, the ground conductor layer 74, and the internal ground conductor layer 78, and the high frequency line-to-waveguide converter can be easily fabricated.

Figure 8A:
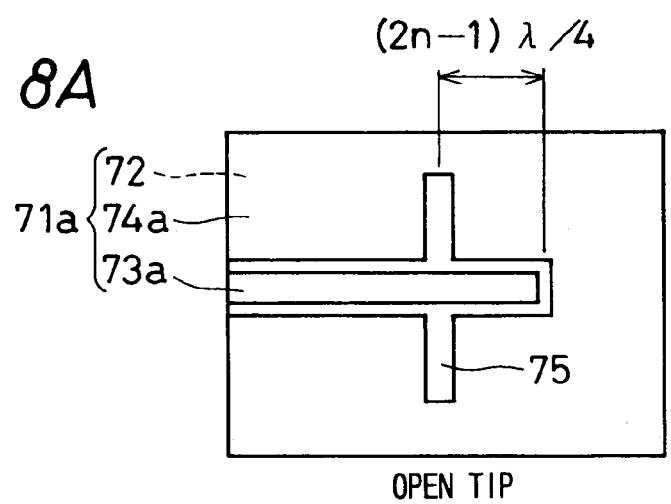

Besides, as exemplified in a plan view of a line conductor 73a of FIG. 8A, when a tip of the line conductor 73a of the high frequency line 71a is opened, and a distance between this open tip and substantially the center part of the slot 75 is made approximately (2n−1)/4 (n is a natural number) of a signal wavelength, an optical path length of a reflected wave transmitted from substantially the center part of the slot 75 to the open tip, totally reflected at the open tip, and returned to substantially the center part of the slot 75 becomes the sum of approximately ½ of the signal wavelength and an integral multiple of the signal wavelength, and further, the phase of the magnetic field is inverted by the total reflection at the open tip, and eventually, this reflected wave and the high frequency signal transmitted through the high frequency line 71a come to have the same phase and intensify each other to be highly coupled to the slot 75, and the conversion efficiency from the high frequency line to the waveguide can be enhanced.

Figure 8B:
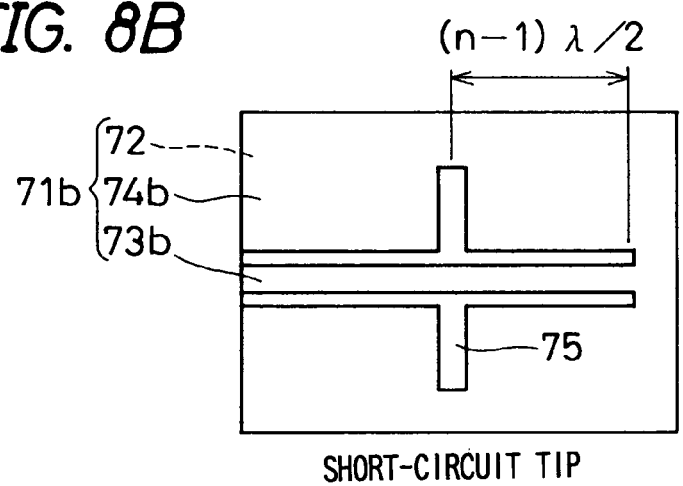

Besides, as exemplified in a plan view of a line conductor 73b of FIG. 8B, when a tip of the line conductor 73b of a high frequency line 71b is short-circuited, and a distance between this short circuit tip and substantially the center part of a slot 75 of the line conductor 73b is made approximately (n−1)/2 (n is a natural number) of a signal wavelength, an optical path length of a reflected wave transmitted from substantially the center part of the slot 75 to the short-circuit tip, totally reflected at the short-circuit tip, and returned to substantially the center part of the slot 75 becomes an integral multiple of the signal wavelength, and the phase of a magnetic field is not changed by the total reflection at the short-circuit tip, and accordingly, this reflected wave and the high frequency signal transmitted through the high frequency line 71b come to have the same phase and intensify each other to be highly coupled to the slot 75, and the conversion efficiency from the high frequency line 71b to the waveguide 76 can be enhanced.

Figure 8C:
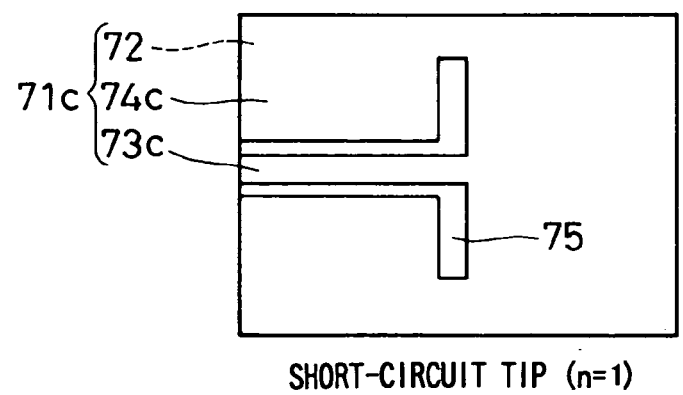

Incidentally, FIG. 8C is a plan view exemplifying a line conductor 73c in a case where n is 1 in the example in which the tip of the line conductor 73c is short-circuited. The tip of the line conductor is short-circuited in the slot part, and the reflection by the short circuit does not change the phase of a magnetic field, so that the reflected wave and the high frequency signal transmitted through the high frequency line come to have the same phase and intensify each other to be highly coupled to the slot 75, and the conversion efficiency from the high frequency line 71c to the waveguide 76 can be enhanced.

Besides, when the ground conductor layer 74 of the high frequency line 71 and the internal ground conductor layer 78 are connected through the connection conductor 80 along the transmission opening 79, it becomes possible to effectively use a region by mounting, for example, a high frequency element onto a portion of the high frequency line 71 outside of the region surrounded by the connection conductor 80, and as a result, a system using the high frequency line-to-waveguide converter can be miniaturized.

A dielectric material forming the dielectric layer 72 is the same as the dielectric layer 42 and 52 of the above-mentioned embodiment and the detailed explanation will be omitted.

As a conductor material forming the line conductor 73, the ground conductor layer 74, the shield conductor part 77 of the through conductor or the like, the internal ground conductor layer 78, and the connection conductor 80, a metalized material containing tungsten, molybdenum, gold, silver, copper or the like as its main ingredient, or a metal foil containing gold, silver, copper, aluminum or the like as its main ingredient is used.

Especially in the case where the high frequency line-to-waveguide converter is incorporated in a wiring substrate on which a high frequency component is mounted, as a dielectric material forming the dielectric layer 72, like the above-mentioned embodiment, it is desirable that a dielectric loss tangent is small, and airtight sealing is possible. As an especially desirable dielectric material, at least one kind of inorganic material selected from a group consisting of aluminum oxide, aluminum nitride, and glass ceramic material can be mentioned. When such a hard material is used, the dielectric loss tangent is small and the mounted high frequency component can be airtightly sealed, so that such a material is preferable in raising the reliability of the mounted high frequency component. In this case, as a conductor material, it is desirable in view of airtightness and productivity to use a metalized conductor which can be fired at the same time as the dielectric material.

The high frequency line-to-waveguide converter of the invention is fabricated as described below. For example, in the case where an aluminum oxide sintered body is used as the dielectric material, first, a suitable organic solvent is added to and mixed with a raw material powder of aluminum oxide, silicon oxide, magnesium oxide, calcium oxide or the like to form slurry, and this is formed into a sheet by a well-known doctor blade method or a calendar roll method to fabricate a ceramic green sheet. Besides, a suitable organic solvent is added to and mixed with a raw material powder of high melting metal, such as tungsten or molybdenum, aluminum oxide, silicon oxide, magnesium oxide, calcium oxide or the like to fabricate a metallization paste. Next, through holes for formation of through conductors as the shield conductor parts 77 and the connection conductor 80 are formed in the ceramic green sheet by, for example, a punching method, and the metallization paste is implanted in the through holes by, for example, a printing method, and subsequently, the metallization paste is printed to have the shape of the ground conductor 74 and the internal ground conductor layer 78 having the line conductor 73 and the slot 75. In the case where the dielectric layer 72 is made of a laminate structure having a plurality of dielectric layers, ceramic green sheets in which these conductors are implanted and printed are laminated, are pressurized to be subjected to pressure bonding, and are fired at a high temperature (about 1600° C.). Further, the surface of the conductor exposed on the surface of the line conductor 73, the ground conductor 74 or the like is plated with nickel and gold.

The shield conductor parts 77 are disposed on the side of or in the inside of the dielectric layer 72 so as to surround the one end of the line conductor 73 and the slot 75, and are electrically connected to the ground conductor layer 74 to be grounded.

The connection conductor 80 is disposed in the dielectric layer 72 so as to surround the transmission opening 79, and electrically connects the ground conductor layer 74 and the internal ground conductor layer 78.

It is desirable that a gap (indicated by G) in FIG. 6A) between the connection conductors 80 is made less than ¼ of the wavelength of the electromagnetic wave in the dielectric layer 72. This is because when the gap is made less than ¼ of the wavelength of the electromagnetic wave, the electromagnetic wave becomes difficult to leak from the gap between the connection conductors, so that the electromagnetic wave becomes difficult to leak to the outside region surrounded by the connection conductors 80 sandwiched between the ground conductor layer 74 and the internal ground conductor layer 78, and the occurrence of a parallel-plate mode as an unnecessary mode which can occur in this region can be suppressed.

Incidentally, the through conductor constituting the connection conductor 80 and the through conductor constituting the shield conductor 77 have only to electrically connect the ground conductor layer 74 and the internal ground conductor layer 78 or the waveguide connection conductor 81, and it may be a so-called through hole conductor in which the inner wall of a through hole is coated with a conductor layer, or may be a so-called via conductor in which the inside of a through hole is filled with a conductor.

It is preferable that a distance between the internal ground conductor layer 78 and the waveguide 76 is made approximately ¼ at the wavelength of the electromagnetic wave excited in the dielectric layer 72 by the signal transmitted through the high frequency line 71 in order to enhance the conversion efficiency of the high frequency line-to-waveguide conversion. When the distance between the internal ground conductor layer 78 and the waveguide 76 is made approximately ¼ of the wavelength of the electromagnetic wave, since an optical path length in which a reflected wave reflected at the boundary between the dielectric layer 72 and the waveguide 76 is totally reflected at the internal ground conductor layer 78 and is returned to the boundary becomes approximately ½ of the wavelength of the electromagnetic wave, the phase is inverted when the reflected wave is returned, and further, the phase is inverted by the total reflection at the internal ground conductor layer 78. Thus, the reflected wave comes to have the same phase as the direct wave directly transmitted to the boundary between the dielectric layer 72 and the waveguide 76 from the slot 75, and these are combined with each other, and the signal is efficiently transmitted to the waveguide 76. Incidentally, when the distance between the internal ground conductor layer 78 and the waveguide 76 is made $(2n-1)/4$ of the wavelength of the electromagnetic wave, where n is a natural number, the optical path difference between the reflected wave and the direct wave becomes substantially ½ of the wavelength of the electromagnetic wave, and the same effect as the above is exerted, and further, the frequency becomes high, and the wavelength of the electromagnetic wave becomes short, and in order to set the distance between the internal ground conductor layer 78 and the waveguide 76 to ¼ of the wavelength of the electromagnetic wave, the thickness of the dielectric layer 72 must be made thin, and in the case where the strength of the dielectric layer is lowered, the distance between the internal ground conductor layer 78 and the waveguide 76 is made ¾, 5/4 or the like of the signal wavelength, so that it is possible to suppress the lowering or the strength of the dielectric layer 72.

The distance between the internal ground conductor layer 78 and the waveguide 76 can be adjusted, in the foregoing fabrication method, by adjusting the thickness of the ceramic green sheet which becomes the dielectric layer 72 after firing. In this case, the adjustment may be made by the thickness of one ceramic green sheet, or the adjustment may be made by laminating a plurality of ceramic green sheets.

The coupling of the high frequency line 71 and the slot 75 is not particularly restricted, and for example, as shown in FIGS. 6A, the tip of the high frequency line 71 may be short-circuited and coupled to the ground conductor layer 74, and in this case, when the distance between the short-circuit tip of the high frequency line 71 and substantially the center part of the slot 75 is set to approximately (n−1)/2 of the signal wavelength, where n is a natural number, in a standing wave formed by synthesis of a traveling wave transmitted through the high frequency line and a reflected wave reflected at the short-circuited tip, a magnetic field becomes highest at substantially the center part of the slot 75, electromagnetic coupling from the high frequency line 71 to the slot 75 through the magnetic field is performed most excellently, and the conversion efficiency of the high frequency line-to-waveguide converter can be enhanced.

Besides, in the case where the tip of the high frequency line 71 is opened, when the distance between the opened tip and substantially the center of the slot 75 is set to approximately (2n 1)/4 of the signal wavelength, where n is a natural number, in a standing wave formed by synthesis of a traveling wave transmitting through the high frequency line 71 and a reflected wave reflected at the opened tip, a magnetic field becomes highest substantially at the center part of the slot 75, electromagnetic coupling from the coplanar line to the slot 75 through the magnetic field is performed most excellently, and the conversion efficiency of the high frequency line-to-waveguide converter can be raised.

The shape of the waveguide 76 is not particularly restricted, and for example, when the WR series regulated as a rectangular waveguide is used, since a measurement correction kit is substantial, various characteristic evaluations become easy. However, according to the frequency of a high frequency signal to be used, for miniaturization and reduction in weight of a system, a miniaturized rectangular waveguide may be used within the range where cutoff of the waveguide does not occur. Besides, a circular waveguide may be used.

The waveguide 76 is the same as the waveguide 46 of the above-mentioned embodiment and the detailed explanation will be omitted.

To attach the waveguide 76 to the high frequency line-to-waveguide converter by joining with solder material is the same as the above-mentioned embodiment and the detailed explanation will be omitted.

The waveguide connection conductor 81 may be simultaneously formed, in the foregoing fabrication method, by printing metallization paste into the shape of the waveguide connection conductor 81 similarly to the formation of the line conductor 73, the ground conductor layer 74 and the internal ground conductor layer 78. Further, similarly to the conductor exposed on the surface, such as the line conductor 73 and the ground conductor layer 74, when the surface is plated with nickel and gold, the wettability of the solder material in the case of the joining with the solder material is improved, and according, this is more desirable.

Incidentally, the invention is not limited to the above examples of the embodiment, and various modifications may be performed within the scope of the gist of the invention.

Figure 6C:
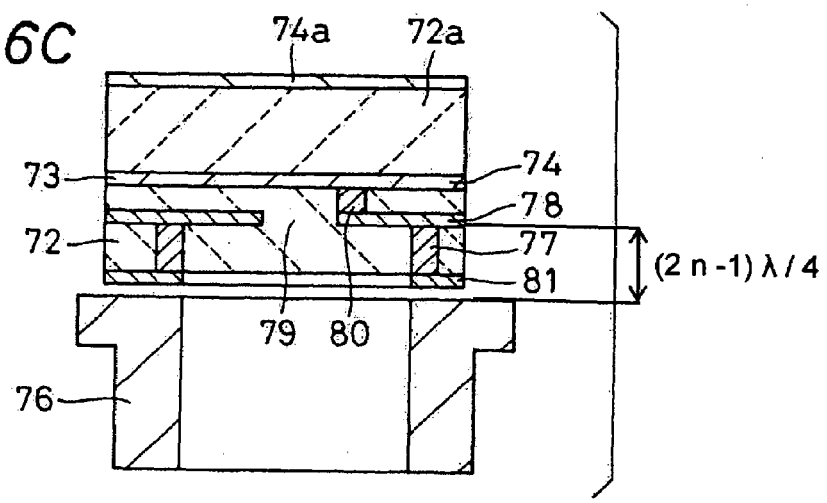
FIG. 6C is a sectional view showing a variation of a high frequency line-to-waveguide converter according to still another embodiment of the invention.

For example, although FIGS. 6A and 6B show the examples in which the high frequency line has the coplanar line structure, a coplanar line structure having a ground may be adopted in which a dielectric layer 72a is further laminated on the dielectric layer 72, and an upper ground conductor layer 74a is provided on the upper surface of the dielectric layer 72a so as to cover the line conductor 73, as shown in FIG. 6C. In any case, when the positional relation among the dielectric layer 72, the line conductor 73, the ground conductor layer 74, the slot 75, the waveguide 76, the shield part 77 and the internal ground conductor layer 78 is made the same as the example shown in FIGS. 6A and 6B, the same effect can be obtained.

Besides, for example, the width of the line conductor 73 is changed between the tip of the line conductor 73 and the slot 75 to change an effective dielectric constant, and the distance between the tip of the line conductor and the slot can also be made approximately (n−1)/2 of the wavelength of the signal to be transmitted in the case of a short circuit, or approximately (2n−1)/4 of the wavelength of the signal to be transmitted in the case of an open circuit.

EXAMPLE

Next, in order to confirm the effect of the high frequency line-to-waveguide converter of the invention, an experiment as described below was carried out.

Figure 9A:
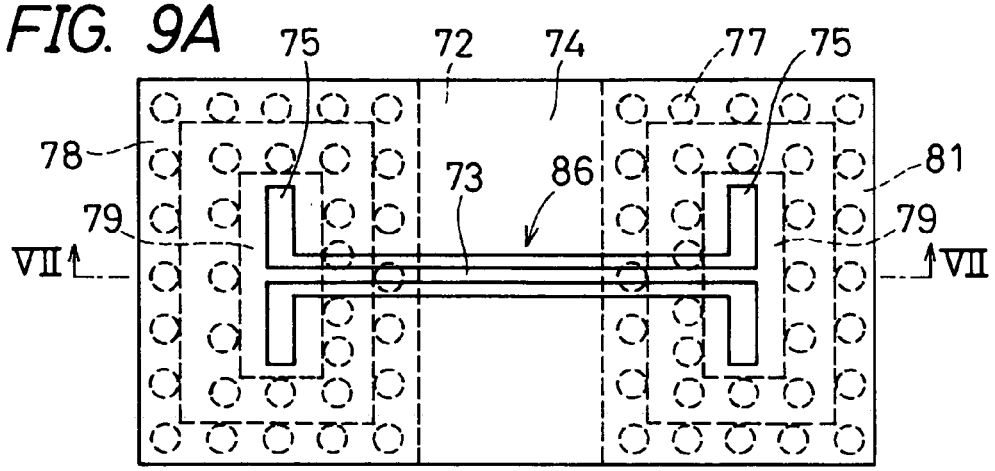
Figure 9B:
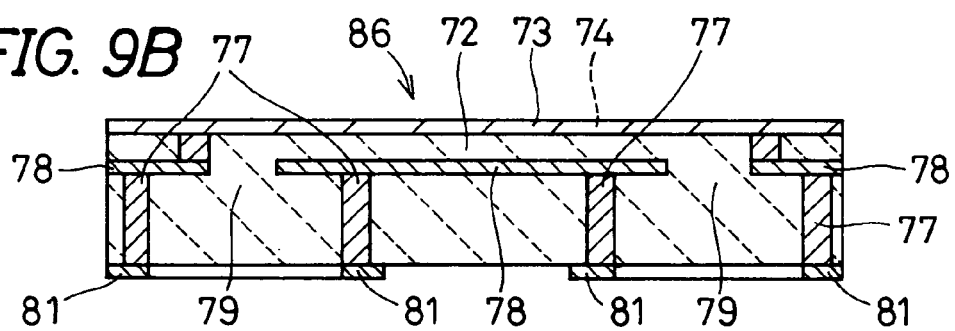
Figure 9C:
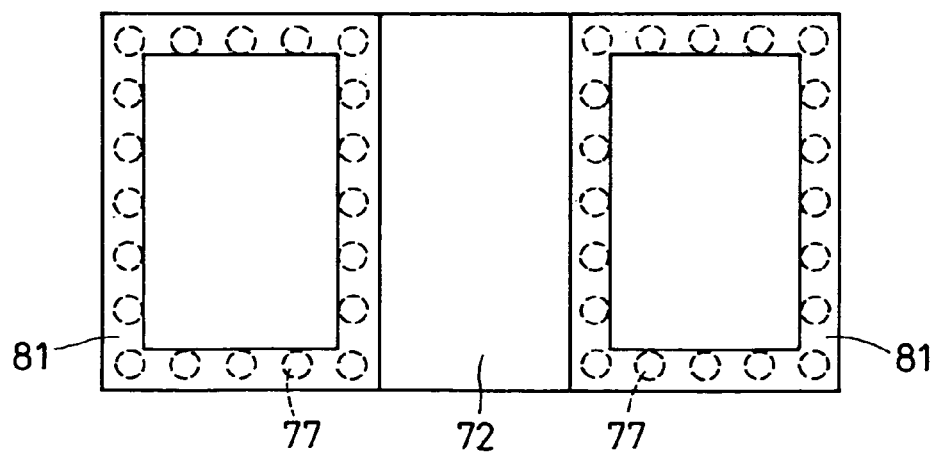

First, by using a ceramic green sheet of alumina ceramic whose dielectric loss tangent at 10 GHz became 0.0006 after firing and a metallization paste for tungsten metallization, an evaluation substrate as shown in FIGS. 9A to 9C was fabricated by a normal green sheet lamination technique and a simultaneous firing technique. Incidentally, FIG. 9A is a top view of the evaluation substrate, FIG. 9B is a sectional view taken along line VII-VII of FIG. 9A, and FIG. 9C is a bottom view.

After firing, the surfaces of respective metallized layers of the upper surface and the lower surface of the evaluation substrate were subjected to plating with nickel and gold. Here, with respect to the high frequency line-to-waveguide converter in the evaluation substrate, the corresponding waveguide was set to a WR-10 for a W band (75 GHz to 110 GHz), and was designed while 76 GHz was made the center frequency. The evaluation substrate includes two high frequency line-to-waveguide converters of the invention at both sides in the drawing, each including the dielectric layer 72, the line conductor 73, the ground conductor layer 74, the slot 75, the shield conductor part 77 made of the shield through conductors, the internal ground conductor layer 78, the transmission opening 79, the connection conductor 80, and the waveguide connection conductor 81 as shown in FIGS. 6A and 6B, and these two converters have such a structure that the line conductors 73, the ground conductor layers 74, and the internal ground conductor layers 78 of both are respectively integrated. The integrated line conductor 73 and ground conductor layer 74, together with the dielectric layer 72, constitute the connection coplanar line 86. The interval between the high frequency line-to-waveguide converters at both sides was made 20 mm so that measuring waveguides could be respectively connected. By this, the evaluation substrate has such a structure that the two high frequency line-to-waveguide converters are connected by the connection coplanar line 86 having a length of 20 mm.

Next, a reflection within the range of 75 GHz to 110 GHz was measured by a method in which a waveguide opening of a measuring waveguide was made to conform to the waveguide connecting conductor 81 of each of the high frequency line-to-waveguide converters of this evaluation substrate and was connected by screwing, a signal was inputted from one of the waveguides, and the signal outputted from the other of the waveguides was measured.

As a result, the reflection at 76 GHz was −16 dB, a steep reflection peak occurring by an unnecessary mode in a pass band was not recognized, and an excellent conversion characteristic was exhibited. Besides, the band of the reflection of −15 dB was 75 GHz to 84 GHz, the band width was 9 GHz, and a relatively broad band characteristic was exhibited.

Figure 10A:
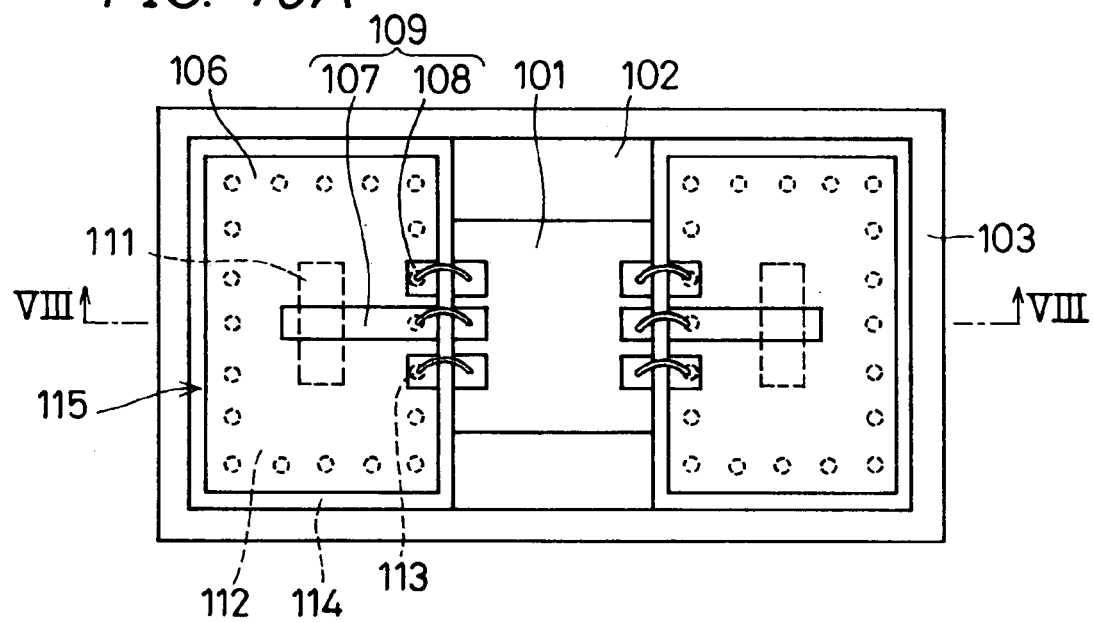
Figure 10B:
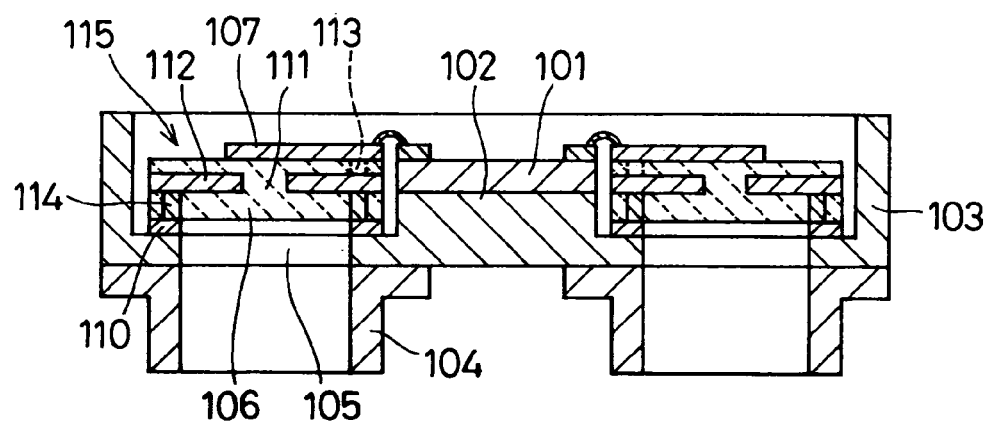

FIGS. 10A and 10B are views showing a high frequency package according to still another embodiment of the invention, in which FIG. 10A is a plan view, and FIG. 10B is a sectional view taken along line VIII-VIII of FIG. 10A. In FIGS. 10A and 10B, reference numeral 101 denotes a high frequency electronic component; reference numeral 102 denotes a mounting part; reference numeral 103 denotes a metal base; reference numeral 104 denotes a waveguide; reference numeral 105 denotes a through hole; reference numeral 106 denotes a dielectric substrate; reference numeral 107 denotes a high frequency line conductor; reference numeral 108 denotes a same surface ground conductor; reference numeral 109 denotes a connection terminal part; reference numeral 110 denotes a frame ground conductor; reference numeral 111 denotes a slot; reference numeral 112 denotes an internal ground conductor; reference numeral 113 denotes a first connection conductor; reference numeral 114 denotes a second connection conductor; and reference numeral 115 denotes a conversion substrate.

In an example of a high frequency package of the invention, a through hole 105 disposed to be adjacent to a mounting part 102 and having a lower side opening connected with a waveguide 104 is formed in a metal base 103 having the mounting part 102 for a high frequency electronic component 101 on an upper surface, a connection terminal part 109 including a high frequency line conductor 107 directed from an outer peripheral part to a center part on an upper surface of a dielectric substrate 106 and a same surface ground conductor 108 disposed to be close to the high frequency line conductor 107 is formed at an upper side of the through hole 105, a frame ground conductor 110 having a shape conforming to an upper side opening of the through hole 105 is formed on the lower surface of the dielectric substrate 106 so as to be opposite to an end of the high frequency line conductor 107 on the center part side, an internal ground conductor 112 provided with a slot 111 coupled with the end of the high frequency line conductor 107 on the center part side in terms of high frequency is formed between the end of the high frequency line conductor 107 on the center part side in the inside of the dielectric substrate 106 and the frame ground conductor 110. A conversion substrate 115 in which the same surface ground conductor 108 is connected to the internal ground conductor 112 through a first connection conductor 113 and the frame ground conductor 110 is connected to the internal ground conductor 112 through a second connection conductor 114, is jointed on the upper side of the through hole 105 of the metal base 103 such that the connection terminal part 109 is positioned on a side of the mounting part 102 and the frame ground conductor 110 is made to conform to the upper side opening of the through hole 105.

That is, the high frequency package according to the embodiment of the invention comprises a metal base 103 and the conversion substrate 115. The metal base 103 has the mounting part 102 for the high frequency electronic component 101 on the upper surface thereof. The through hole 105 disposed to be adjacent to the mounting part 102 and having the lower side opening connected with the waveguide 104, is formed in the metal base 103.

The conversion substrate 115 has the dielectric substrate 106, the connection terminal part 109, the frame ground conductor 110, the internal ground conductor 112, the first connection conductor 113 and the second connection conductor 114. The connection terminal part 109 includes the high frequency line conductor 107 disposed so as to extend from the outer peripheral part toward the center part on the upper surface of the dielectric substrate 106, and the same surface ground conductor 108 disposed to be close to the high frequency line conductor 107 on the upper surface of the dielectric substrate 106.

The frame ground conductor 110 is formed on the lower surface of the dielectric substrate 106 in a shape conforming to the upper side opening of the through hole 105 so as to be opposite to the end of the high frequency line conductor 107 on the center part side. The internal ground conductor 112 is formed in the inside of the dielectric substrate 106 and between the end of the high frequency line conductor 107 on the center part side and the frame ground conductor 110. The internal ground conductor 112 is provided with a slot 111 coupled with the end of the high frequency line conductor 107 on the center part side in terms of high frequency. The first connection conductor 113 connects the same surface ground conductor 108 and the internal ground conductor 112. The second connection conductor 114 connects the frame ground conductor 110 and the internal ground conductor 112.

The conversion substrate 115 is jointed on the upper side of the through hole 105 of the metal base 103 such that the connection terminal part 109 is positioned on the side of the mounting part 102 of the metal base 103 and the frame ground conductor 110 is made to conform to the upper side opening of the through hole 105 of the metal base 103.

By adopting the structure as stated above, the conversion substrate 115 and the high frequency electronic component 101 are separately fabricated, and subsequently, the ground of the conversion substrate 115 and the ground of the high frequency electronic component 101 can be connected by wire bonding from the outside, and contrary to the related art, it is not necessary to extend the internal ground conductor 112 of the conversion substrate 115, to provide the mounting part of the high frequency electronic component 101 formed to be exposed on the surface, and to previously internally connect the ground of the conversion substrate 115 and the ground of the high frequency electronic component 101 by the internal ground conductor 112. Thus, the conversion substrate 115 can be miniaturized, and a thermal expansion mismatch between the conversion substrate 115 and the metal base 103 in the manufacturing process of the high frequency package can be made small, so that the warp or crack of the package can be prevented.

Besides, when the high frequency line conductor 107 of the conversion substrate 115 is connected to the high frequency line conductor of the high frequency electronic component 101 by wire bonding, and the same surface ground conductor 108 of the conversion substrate 115 is bonded to the ground conductor of the high frequency electronic component 101 by wire bonding, the connection distance between the high frequency line conductors and the connection distance between the same surface ground conductors can be made substantially the same distance, and transmission becomes possible without causing a difference between the phase of the signal potential of the high frequency signal and the phase of the ground potential in the connection part of both, and excellent transmission of the high frequency signal becomes possible.

On the other hand, in the case where the conversion substrate 115 does not have the same surface ground conductor 108, although the high frequency line conductor 107 of the conversion substrate 115 and the high frequency line conductor of the high frequency electronic component 101 are connected by wire at a relatively short distance, a high frequency signal reaches the internal ground conductor 112, which gives the ground potential of a high frequency signal transmitted through the high frequency line conductor 107 of the conversion substrate 115, from the mounting part 102 as the ground part of the high frequency electronic component 101 through the metal base 103, the frame conductor 110, and the second connection conductor 114, and the distance becomes very long as compared with the connection distance between the high frequency line conductors, the phase of the ground potential in the high frequency electronic component 101 becomes later than the phase of the signal potential by the extended length of the connection distance, and there is a case where the high frequency signal can not be excellently transmitted.

In the structure of the conventional high frequency line-to-waveguide converter, the high frequency electronic component 101 is mounted on the portion where the internal ground conductor 112 of the high frequency line-to-waveguide converter is extended and exposed on the surface, and the ground potential of the high frequency electronic component 101 is directly transmitted to the high frequency line-to-waveguide converter by the internal ground conductor 112, so that the delay to the signal potential hardly occurs, and it is not necessary to provide the same surface ground conductor layer 108 on the upper surface of the conversion substrate 115 and to make connection. However, in this case, it is necessary that the internal ground conductor 112 or the dielectric substrate 106 is extended to be exposed on the surface, and the mounting part for mounting of the high frequency electronic component 101 is integrally formed with the high frequency line-to-waveguide converter, and accordingly, the dielectric substrate 106 becomes large, and there is a case where the warp or crack occurs at the joining to the metal base 103. In the high frequency package of the invention, the same surface ground conductor 108 is formed on the conversion substrate 115, so that the connection of the grounds of the conversion substrate 115 and the high frequency electronic component 101 can also be performed by wire bonding, and it becomes unnecessary to provide the mounting part of the high frequency electronic component 101 which is formed by extending the internal ground conductor 112 of the conversion substrate 15 and exposing it on the surface, the conversion substrate 115 is miniaturized, and the warp or crack at the joining to the metal base 103 can be suppressed.

Besides, in the high frequency package of the invention, when the interval between the high frequency line conductor 107 and the same surface ground conductor layer 108 is made ¼ or less of the signal wavelength of the high frequency signal transmitted through the high frequency line conductor 107, in the case where the high frequency line conductor 107 of the conversion substrate 115 and the high frequency line conductor of the high frequency electronic component 101, and the same surface ground conductor 108 of the conversion substrate 115 and the same surface ground conductor of the high frequency electronic component 101 are respectively connected by wire bonding, the distance between the wire for connecting the high frequency line conductors and the wire for connecting the same surface ground conductors can be made approximately ¼ or less of the signal wavelength of the high frequency signal, the respective wires are electromagnetically coupled to each other to form a high frequency transmission path, and the high frequency package excellent in transmission of the high frequency signal can be provided.

Besides, in the high frequency package of the invention, in the case where the same surface ground conductor 100 is disposed at both sides of the high frequency line conductor 107, the wire for connecting the high frequency line conductors of the conversion substrate 115 and the high frequency electronic component 101 and the wire for connecting the ground conductor of them are coupled to each other and transmit the high frequency signal as a high frequency transmission path of a signal transmission principle similar to the coplanar line, and the high frequency package excellent in transmission of the high frequency signal can be provided.

Besides, in the high frequency package of the invention, since the conversion substrate 115 is joined to the metal base 103 having the mounting part 102 of the high frequency electronic component 101, the high frequency electronic component 101 is directly connected to the metal base 103, and heat generation due to the operation of the high frequency electronic component 101 can be dissipated through the metal base 103, and the high frequency package excellent in thermal dissipation can be provided.

Since the same surface ground conductor 108 is connected to the internal ground conductor 112 through the first connection conductor 113, the high frequency signal is transmitted from the outer peripheral part of the high frequency line conductor 107 toward the center part of the dielectric substrate 106 along the internal ground conductor 112, and is transmitted through the slot 111, which is provided to be coupled with the end of the high frequency line conductor 107 on the center part side of the dielectric substrate 106 in terms of high frequency, to the through hole 105 to which the lower side waveguide 104 is connected. The internal ground conductor 112 provided with the slot 111 is connected to the frame ground conductor 110 through the second connection conductor 114, and the high frequency signal is transmitted to the waveguide 104.

Here, when the length (slot length) or the slot 111 in the direction orthogonal to the high frequency line conductor 107 is generally made approximately ½ of the high frequency signal wavelength so that the slot 111 is coupled with the high frequency line conductor 107 in terms of high frequency, a standing wave in which magnetic field intensity at the center part of the slot 111 becomes maximum occurs in the slot 111, and coupling efficiency by the magnetic field to the high frequency line conductor 107 is increased.

Besides, when the distance between the internal ground conductor 112 and the frame ground conductor layer 110 is made approximately ¼ of the high frequency signal in the dielectric substrate 106 or odd number times as long as that, the phase of a direct wave radiated from the slot 111 and directly transmitted from the dielectric substrate 106 to the waveguide 104 becomes equal to the phase of a reflected wave reflected at the boundary between the dielectric substrate 106 and the waveguide 104, again reflected at the internal ground conductor 112 and reaching the boundary between the dielectric substrate 106 and the waveguide 104, and they intensify each other, so that the coupling efficiency of the slot 111 and the waveguide 104 is increased.

Figure 11A:
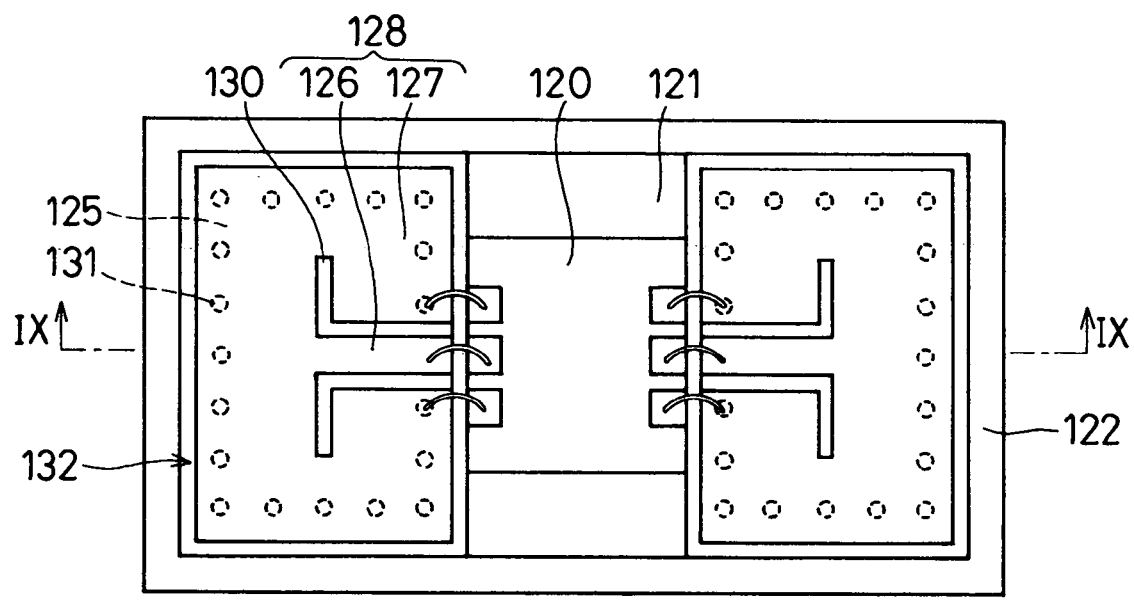
Figure 11B:
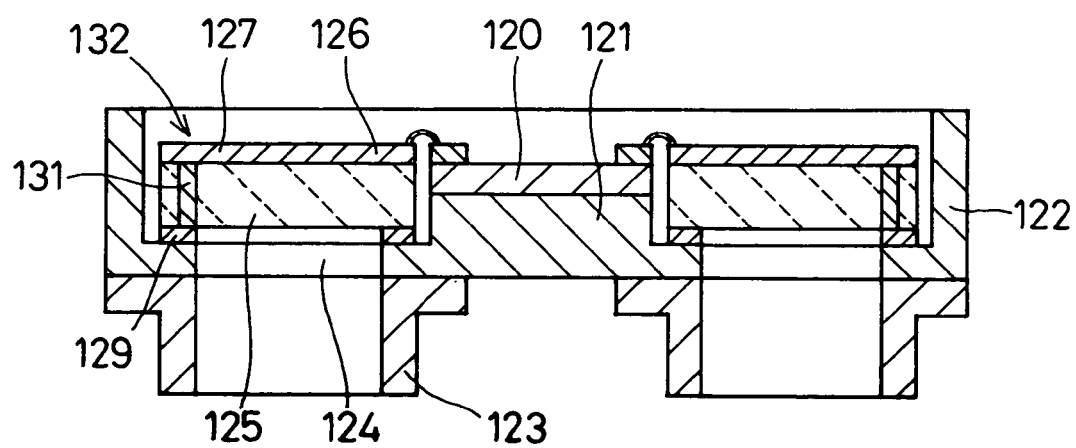

FIGS. 11A and 11B are views showing a high frequency package according to still another embodiment of the invention, in which FIG. 11A is a plan view, and FIG. 11B is a sectional view taken along line IX-IX of FIG. 11A. In FIGS. 11A and 11B, reference numeral 120 denotes a high frequency electronic component; reference numeral 121 denotes a mounting part; 122 reference numeral denotes a metal base; reference numeral 123 denotes a waveguide; reference numeral 124 denotes a through hole; reference numeral 125 denotes a dielectric substrate; reference numeral 126 denotes a high frequency line conductor; reference numeral 127 denotes a same surface ground conductor; reference numeral 120 denotes a connection terminal part; reference numeral 129 denotes a frame ground conductor; reference numeral 130 denotes a slot; reference numeral 131 denotes a connection conductor; and reference numeral 132 denotes a conversion substrate.

In the example of the high frequency package of the invention, a through hole 124 disposed to be adjacent to a mounting part 121 and having a lower side opening connected with a waveguide 123 is formed in a metal base 122 having the mounting part 121 for a high frequency electronic component 120 on an upper surface, a connection terminal part 128 including a high frequency line conductor 126 directed from an outer peripheral part to a center part on an upper surface of a dielectric substrate 125 and a same surface ground conductor 127 disposed on the same surface so as to surround an end of the high frequency line conductor 126 on the center part side is formed at an upper side of the through hole 124, a frame ground conductor 129 having a shape conforming to an upper side opening of the through hole 124 is formed on a lower surface of the dielectric substrate 125 so as to be opposite to the end of the high frequency line conductor 126 on the center part side, a slot 130 formed to be orthogonal to the end of the high frequency line conductor 126 on the center part side and coupled with the high frequency line conductor 126 in terms of high frequency is provided in the same surface ground conductor 127. A conversion substrate 132 in which the same surface ground conductor 127 is connected to the frame ground conductor 129 through a connection conductor 131 is joined on the upper side of the through hole 124 such that the connection terminal part 128 is positioned one a side of the mounting part 121 and the frame ground conductor 129 is made to conform to an upper side opening of the through hole 124.

That is, the high frequency package according to the embodiment of the invention comprises the metal base 122 and the conversion substrate 132. The metal base 122 has the mounting part 121 for the high frequency electric component 120 on the upper surface thereof. The through hole 124 disposed to be adjacent to the mounting part 121 and having the lower side opening connected with the waveguide 123, is formed in the metal base 122.

The conversion substrate 132 has the dielectric substrate 125, the connection terminal part 128, the frame ground conductor 129 and the connection conductor 131. The connection terminal conductor 128 includes the high frequency line conductor 126 formed on the upper surface of the dielectric substrate 125 and disposed so as to extend from the outer peripheral part toward the center part on the upper surface of the dielectric substrate 125, and the same surface ground conductor 127 disposed on the same surface as the upper surface of the dielectric substrate 125 so as to surround the end of the high frequency line conductor 126 on the center part side. The same surface ground conductor 127 is provided with the slot 130 formed to be orthogonal to the end of the high frequency line conductor 126 on the center part side and coupled with the high frequency line conductor 126 in terms of high frequency.

The frame ground conductor 129 is formed on the lower surface of the dielectric substrate 125 in a shape conforming to the upper side opening of the through hole 124 so as to be opposite to the end of the high frequency line conductor 126 on the center part side. The connection conductor 131 connects the same surface ground conductor 127 and the frame ground conductor 129.

The conversion substrate 132 is joined on the upper side of the through hole 124 of the metal base 122 such that the connection terminal part 128 is positioned on the side of the mounting part 121 of the metal base 122 and the frame ground conductor 129 is made to conform to the upper side opening of the through hole 124 of the metal base 122.

By adopting the structure as stated above, it becomes possible to connect the ground of the conversion substrate 132 and the ground of the high frequency electronic component 120 by wire bonding, and it is not necessary to provide the mounting part, which is formed by extending the dielectric substrate 125, of the high frequency electronic component 120 as in the related art, and the conversion substrate 132 can be miniaturized, and a thermal expansion mismatch between the conversion substrate 132 and the metal base 122 in the manufacture process of the high frequency package can be made small, so that the warp or crack of the package can be prevented.

Besides, when the high frequency line conductor 126 of the conversion substrate 132 is connected to the high frequency line conductor of the high frequency electronic component 120 by wire bonding, and the same surface ground conductor 127 of the conversion substrate 132 is bonded to the ground conductor of the high frequency electronic component 120 by wire bonding, the connection distance between the high frequency line conductors and the connection distance between the same surface ground conductors can be made substantially the same distance, and transmission becomes possible without causing a difference between the phase of the signal potential of the high frequency signal and the phase of the ground potential in the connection part of both, and excellent transmission of the high frequency signal becomes possible.

Besides, in the high frequency package of the invention, when the interval between the high frequency line conductor 126 and the same surface ground conductor layer 127 is made ¼ or less of the signal wavelength of the high frequency signal transmitted through the high frequency line conductor 126, in the case where the high frequency line conductor 126 of the conversion substrate 132 and the high frequency line conductor of the high frequency electronic component 120, and the same surface ground conductor 127 of the conversion substrate 132 and the same surface ground conductor of the high frequency electronic component 120 are respectively connected by wire bonding, the distance between the wire for connecting the high frequency line conductors and the wire for connecting the same surface ground conductors can be made approximately ¼ or less of the signal wavelength of the high frequency signal, the respective wires are electromagnetically coupled to each other to form a high frequency transmission path, and the high frequency package excellent in transmission of the high frequency signal can be provided.

Besides, in the high frequency package of the invention, since the coplanar line made of the high frequency line conductor 126 and the same surface ground conductor 127 is used as the high frequency line on the upper surface of the conversion substrate 132, when the high frequency line conductor 126 of the conversion substrate 132 and the high frequency line conductor of the high frequency electronic component 120, and the same surface ground conductor layer 127 and the sample surface ground conductor of the high frequency electronic component 120 are respectively connected to each other by wire bonding, since the ground potential of the same surface ground conductor of the high frequency electronic component 120 is directly transmitted by wire to the same surface ground conductor 127 of the coplanar line of the conversion substrate 132, so that it is possible to provide the high frequency package which has no delay for transmission of the signal potential of the high frequency line conductor of the high frequency electronic component 120 and is excellent in transmission of the high frequency signal.

Besides, in the high frequency package of the invention, the slot 130 playing an important role when the high frequency line on the upper surface of the conversion substrate 132 is converted to the waveguide 123 is formed on the upper surface of the conversion substrate 132. The length and width of this slot 130 influences the conversion efficiency in conversion of the high frequency line to the waveguide 123, and when the length of the slot 130 is made approximately ½ of the high frequency signal wavelength, a standing wave in which magnetic field intensity at the center part of the slot 130 becomes maximum occurs in the slot 130, and the coupling efficiency to the high frequency line by the magnetic field is enhanced. When the width of the slot 130 is formed to have impedance equal to impedance of the high frequency line, the impedance mismatch between the high frequency line and the slot 130 is eliminated and the coupling efficiency to the high frequency line at the signal frequency is enhanced.

Besides, when the width of the slot 130 is formed to have impedance larger than impedance of the high frequency line, a state at the signal frequency deviates from the impedance matching state, and the coupling efficiency to the high frequency line is slightly decreased. However, even if the frequency is changed in the vicinity of the signal frequency, the phase of the impedance mismatch is merely changed, and the magnitude of the impedance mismatch is not changed much, and the coupling is performed while the state where the coupling efficiency to the high frequency line is high is kept, so that the frequency band is broadened.

Besides, by adopting the package of this structure, it becomes possible to check the size of the slot from the outside, and it is possible to provide the high frequency package in which the high frequency line to-waveguide conversion efficiency is excellent.

The high frequency signal converted from the high frequency line by the slot 130 is transmitted to the waveguide 123 similarly to the example of the embodiment of the invention. When the distance between the same surface ground conductor 127, the high frequency line conductor 126 and the frame ground conductor 129 in set to approximately ¼ of or odd number times as long as the high frequency signal wavelength in the dielectric substrate 125, the phase of a direct wave radiated from the slot 130 and directly transmitted from the dielectric substrate 125 to the waveguide 123 becomes identical to the phase of a reflected wave reflected at the boundary between the dielectric substrate 125 and the waveguide 123, again reflected at the same surface ground conductor 127, and having reached the boundary between the dielectric substrate 125 and the waveguide 123, and they intensify each other, so that the high frequency signal is efficiently converted and transmitted to the waveguide.

Figure 12A:
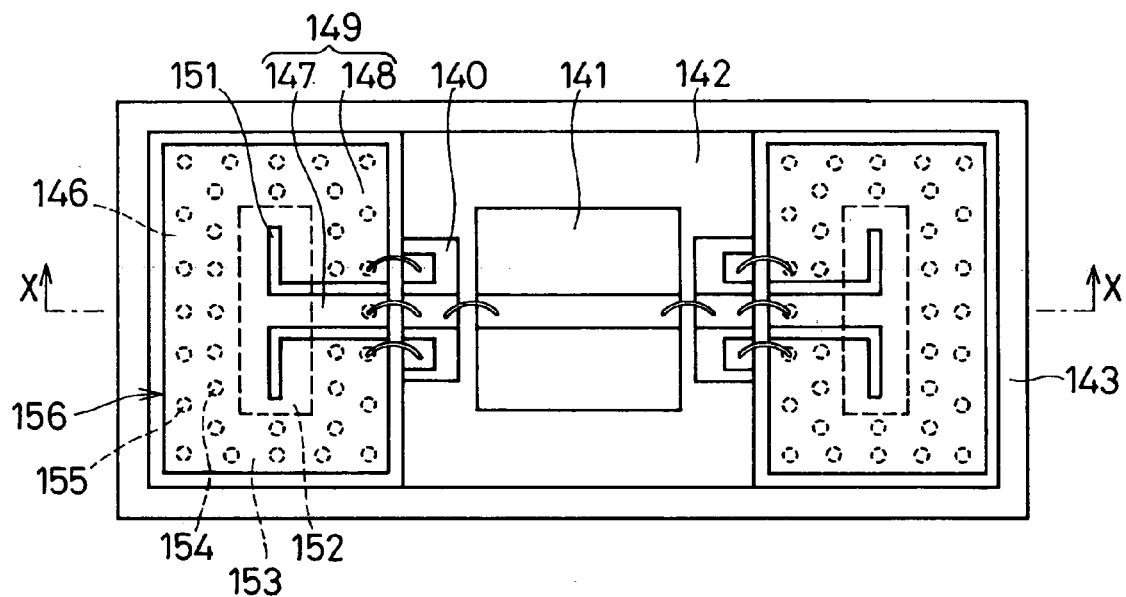
Figure 12B:
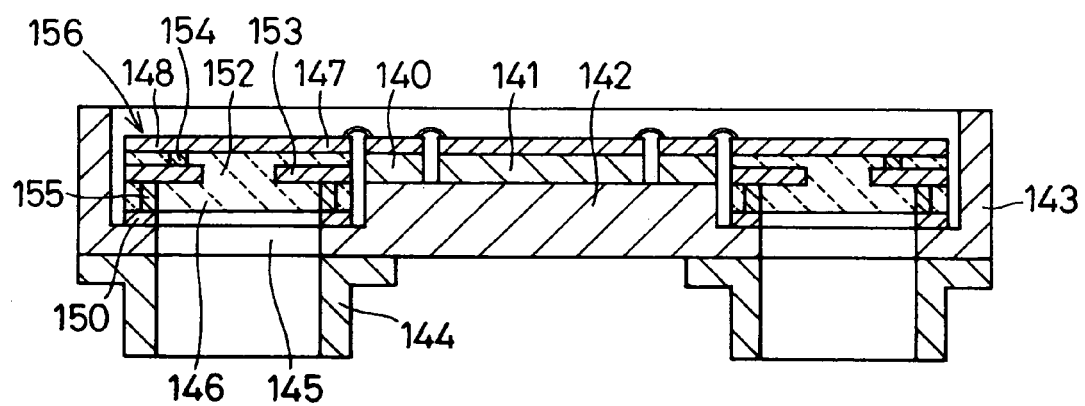

FIGS. 12A and 12B are views showing a high frequency package according to still another embodiment of the invention, in which FIG. 12A is a plan view, and FIG. 12B is a sectional view taken along line X-X of FIG. 12A. In FIGS. 12A and 12B, reference numeral 140 denotes a high frequency electronic component; reference numeral 141 denotes a second high frequency electronic component: reference numeral 142 denotes a mounting part; reference numeral 143 denotes a metal base; reference numeral 144 denotes a waveguide; reference numeral 145 denotes a through hole: reference numeral 146 denotes a dielectric substrate; reference numeral 147 denotes a high frequency line conductor: reference numeral 148 denotes a same surface ground conductor; reference numeral 149 denotes a connection terminal part; reference numeral 150 denotes a frame ground conductor; reference numeral 151 denotes a slot; reference numeral 152 denotes a transmission opening; reference numeral 153 denotes an internal ground conductor; reference numeral 154 denotes a first connection conductor; reference numeral 155 denotes a second connection conductor; and reference numeral 156 denotes a conversion substrate.

In the example of the high frequency package of the invention, a through hole 145 disposed to be adjacent to a mounting part 142 and having a lower side opening connected with a waveguide 144 is formed in a metal base 143 having the mounting part 142 for a high frequency electronic component 140 and 141 on an upper surface, a connection terminal part 149 including a high frequency line conductor 147 directed from an outer peripheral part to a center part on an upper surface of a dielectric substrate 146 and a same surface ground conductor 148 disposed on the same surface so as to surround an end of the high frequency line conductor 147 on the center part side is formed at an upper side of the through hole 145, a frame ground conductor 150 having a shape conforming to an upper side opening of the through hole 145 is formed on a lower surface of the dielectric substrate 146 so as to be opposite to the end of the high frequency line conductor 147 on the center part side, a slot 151 formed to be orthogonal to the end of the high frequency line conductor 147 on the center part side and coupled with the high frequency line conductor 147 in terms of high frequency is provided in the same surface ground conductor 148, and the internal ground conductor 153 provided with the transmission opening 152 opposite to the slot 151 and larger than the slot 151 is formed between the high frequency line conductor 147 of the inside of the dielectric substrate 146 and the frame ground conductor 150, and the conversion substrate 156 in which the same surface ground conductor 140 is connected to the internal ground conductor 153 through the first connection conductor 154 and the frame ground conductor 150 is connected to the internal ground conductor 153 through the second connection conductor 155, is joined on the upper side of the through hole 145 such that the frame ground conductor 150 is made to conform to the upper opening of the through hole 145.

That is, the high frequency package according to the embodiment of the invention comprises the metal base 143 and the conversion substrate 156. The metal base 143 has the mounting part 142 for high frequency electric component 140 and 141 at the upper surface thereof. The through hole 145 disposed to be adjacent to the mounting part 142 and having the lower side opening connected with the waveguide 144, is formed in the metal base 143.

The conversion substrate 156 has the dielectric substrate 146, the connection terminal part 149, the frame ground conductor 150, the internal ground conductor 153, the first connection conductor 154 and the second connection conductor 155. The connection terminal part 149 includes the high frequency line conductor 147 disposed so as to extend from the outer peripheral part toward the center part on the upper surface of the dielectric substrate 146, and the same surface ground conductor 148 disposed on the same surface as the upper surface of the dielectric substrate 146 so as to surround the end of the high frequency line conductor 147 on the center part side. The same surface ground conductor 140 is provided with the slot 151 formed to be orthogonal to the end of the high frequency line conductor 147 on the center part side and coupled with the high frequency line conductor 147 in terms of high frequency.

The frame ground conductor 150 is formed on the lower surface of the dielectric substrate 146 in a shape conforming to the upper side opening of the through hole 145 so as to be opposite to the end of the high frequency line conductor 147 on the center part side. The internal ground conductor 153 is formed between the high frequency line conductor 147 of the inside of the dielectric substrate 146 and the frame ground conductor 150. Besides, the internal ground conductor 153 is provided with the transmission opening 152 opposite to the slot 151 and larger than the slot 151. The first connecting conductor 154 connects the same surface ground conductor 148 and internal ground conductor 153. The second connecting conductor 155 connects the frame ground conductor 150 and the internal ground conductor 153.

The conversion substrate 156 is joined on the upper side of the through hole 145 of the metal base 143 such that the connection terminal part 149 is positioned on the side of the mounting part 142 of the metal base 143 and the frame ground conductor 150 is made to conform to the upper side opening of the through hole 145 of the metal base 143.

By adopting the structure as stated above, it becomes possible to connect the ground of the conversion substrate 156 and the ground of the high frequency electronic component 140 and 141 by wire bonding, and it is not necessary to provide the mounting part of the high frequency electronic components 140 and 141, which is formed by extending the internal ground conductor 153 of the conversion substrate 156 to be exposed on the surface as in the related art, and the conversion substrate 156 can be miniaturized, and a thermal expansion mismatch between the conversion substrate 156 and the metal base 143 in the manufacture process of the high frequency package can be made small, so that the warp or crack of the package can be prevented.

Besides, the connection distance between the high frequency line conductor 147 of the conversion substrate 156 and the high frequency line conductor of the high frequency electronic component 140 can be made substantially equal to the connection distance between the same surface ground conductor 148 of the conversion substrate 156 and the same surface ground conductor of the high frequency electronic component 140, and transmission becomes possible without causing a difference between the phase of the signal potential of the high frequency signal and the phase of the ground potential in the connection part of both, and excellent transmission of the high frequency signal becomes possible.

In this case, the dielectric waveguide part surrounded by the internal ground conductor 153 and the second connection conductor 155 is shielded by the internal ground conductor 153 from the high frequency transmission path of the coplanar line type made of the high frequency line conductor 147 and the same surface ground conductor 148, and the electromagnetic resonant mode in the dielectric waveguide part is separated from the electromagnetic transmission mode occurring in the high frequency transmission path. Thus, there disappears a possibility that the high frequency signal transmitted through the high frequency transmission path of the coplanar line type made of the high frequency line conductor 147 and the same surface ground conductor 148 causes an unnecessary resonance in the dielectric waveguide part surrounded by the internal ground conductor 153 and the second connection conductor 55, and excellent conversion from the high frequency transmission path of the coplanar line type to the waveguide becomes possible.

Besides, in the high frequency package of the invention, when a shield plate having, in a portion corresponding to the high frequency line conductor of the high frequency electronic part 140, a small opening (an opening in which a cutoff frequency is higher than a signal frequency) through which an electromagnetic wave at the signal frequency can not pass is mounted on the upper surface of the high frequency electronic component 140, the mount region of the conversion substrate 156 and the mount region of the high frequency electronic component 141 are shielded in high frequencies, and it is possible to provide the high frequency package which is excellent in isolation characteristic to an unnecessary signal.

Besides, even in the case where the second high frequency electronic component 141 without the same surface ground conductor is mounted, when a component having a same surface ground conductor, such as the high frequency electronic component 140, is disposed between the conversion substrate 156 and the second, high frequency component 141, and they are respectively connected by wire bonding, it becomes possible to perform excellent transmission of a high frequency signal between the conversion substrate 156 and the second high frequency component 141.

Besides, in the high frequency package of the invention, when the interval between the high frequency line conductor 147 and the same surface ground conductor layer 148 is made ¼ or less of the signal wavelength of the high frequency signal transmitted through the high frequency line conductor 147, in the case where the high frequency line conductor 147 of the conversion substrate 156 and the high frequency line conductor of the high frequency electronic component 140, and the same surface ground conductor 140 of the conversion substrate 156 and the same surface ground conductor of the high frequency electronic component 140 are respectively connected by wire bonding, the distance between the wire for connecting the high frequency line conductors and the wire for connecting the same surface ground conductors can be made approximately ¼ or less of the signal wavelength of the high frequency signal, the respective wires are electromagnetically coupled to each other to form a high frequency transmission path, and the high frequency package excellent in transmission of the high frequency signal can be provided.

As a dielectric material forming the dielectric layer 106, 125 and 146, aluminum oxide, aluminum nitride, silicon nitride, ceramic material containing mullite or the like as its main ingredient, glass, glass ceramic material formed by firing a mixture of glass and ceramic filler, epoxy resin, polyimide resin, organic resin material such as fluorine resin including tetrafluoroethylene resin, organic resin–ceramic (including glass) composite material or the like is used.

As a conductor material forming the high frequency line conductor 107, 126 and 147, the same surface ground conductor 108, 127 and 148, the frame ground conductor 110, 129 and 150, the internal ground conductor 112 and 153, the first connection conductor 113 and 154, the second connection conductor 114 and 155 and connection conductor 131, a metallized material containing tungsten, molybdenum, gold, silver, copper or the like as its main ingredient, or a metal foil containing gold, silver, copper, aluminum or the like as its main ingredient is used.

Especially, in the case where the high frequency package contains and seals an electronic component, as the dielectric material forming the dielectric substrates 106, 125 and 146, it is desirable that the dielectric loss tangent is small and airtight sealing is possible. As an especially desirable dielectric material, at least one kind of inorganic material selected from a group consisting of aluminum oxide, aluminum nitride, and glass ceramic material can be mentioned. When such a hard material is used, the dielectric loss tangent is small and the mounted high frequency component can be airtightly sealed, so that such a material is preferable in raising the reliability of the mounted high frequency component. In this case, as a conductor material, it is desirable in view of airtightness and productivity to use a metalized conductor which can be fired at the same time as the dielectric material.

As metal material forming the metal bases 103, 122 and 143, an alloy, a compound, a composite material or the like containing iron, cobalt, nickel, tungsten, molybdenum, copper or the like as its main ingredient is used.

The high frequency package converter of the invention is fabricated as described below. For example, in the case where an aluminum oxide sintered body is used as the dielectric substrate material, first, a suitable organic solvent is added to and mixed with a raw material powder of aluminum oxide, silicon oxide, magnesium oxide, calcium oxide or the like to form slurry, and this is formed into a sheet by a well-known doctor blade method or a calendar roll method to fabricate a ceramic green sheet. Besides, a suitable organic solvent is added to and mixed with a raw material powder of high melting metal, such as tungsten or molybdenum, aluminum oxide, silicon oxide, magnesium oxide, calcium oxide or the like to fabricate a metallization paste. Next, through holes for formation of the first connection conductor 113 and 154, the second connection conductor 114 and 155 and the connection conductor 131 as the via hole conductor is formed in the ceramic green sheet by, for example, a punching method, and the metallization paste is implanted in the through holes by, for example, a printing method, and subsequently, the metallization paste is printed to have the shape of the high frequency line conductor 107, 126 and 147, the same ground conductor 108, 127 and 148, the frame ground conductor 110, 129 and 150 and the internal ground conductor 112 and 153. In the case where the dielectric substrate 106, 125 and 146 is made of a laminate structure having a plurality of dielectric layers, ceramic green sheets in which these conductors are implanted and printed are laminated, are pressurized to be subjected to pressure bonding, and are fired at a high temperature (about 1600° C.). Further, the surfaces of the conductors exposed on the surfaces, such as the high frequency line conductors 107, 126 and 147, the same surface ground conductors 108, 127 and 148, and the frame ground conductors 110, 129 and 150, are plated with nickel or gold according to the subsequent assembly to form the conversion substrates 115, 132 and 156.

The conversion substrates 115, 132 and 156 are joined by solder material, such as silver copper solder or gold tin solder, to the upper side openings of the through holes 105, 124 and 145 to which the waveguides 104, 123 and 144 of the metal bases 103, 122 and 143 are connected. In the case where the solder material is the silver copper solder, since the conversion substrates 115, 132 and 155 and the metal bases 103, 122 and 143 are joined in the state of nickel plating finish, after joining, nickel or gold plating is applied to finish up. In the case where the solder material is the gold tin solder, since the conversion substrates 115, 132 and 156 and the metal bases 103, 122 and 143 are joined in the state of nickel or gold plating finish, specific plating is not applied after the metal base joining.

In the example of the high frequency package of the invention, although the case where the waveguides 104, 123 and 144 are rectangular waveguides has been described, the shape of the waveguides 104, 123 and 144 is not particularly limited, and for example, a circular waveguide may be used.

Incidentally, the invention is not limited to the above examples of the embodiment, and various modifications may be performed within the scope of the gist of the invention.

For example, in FIGS. 10A and 10B, although the example has been described in which the end of the high frequency line conductor 107 at the center side of the dielectric substrate 106 is opened in order to perform electromagnetic coupling of the high frequency line conductor 107 and the slot 111, the end of the high frequency line conductor 107 at the center side of the dielectric substrate 106 may be short-circuited to the internal ground conductor 112 by the via hole conductor or the like in the vicinity of the slot 111 to perform the electromagnetic coupling.

Figure 13:
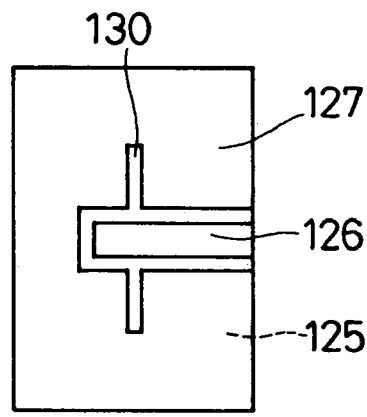
FIG. 13 is a plan view showing a high frequency line conductor of a conversion substrate of the high frequency package according to still another embodiment of the invention.
Figure 14:
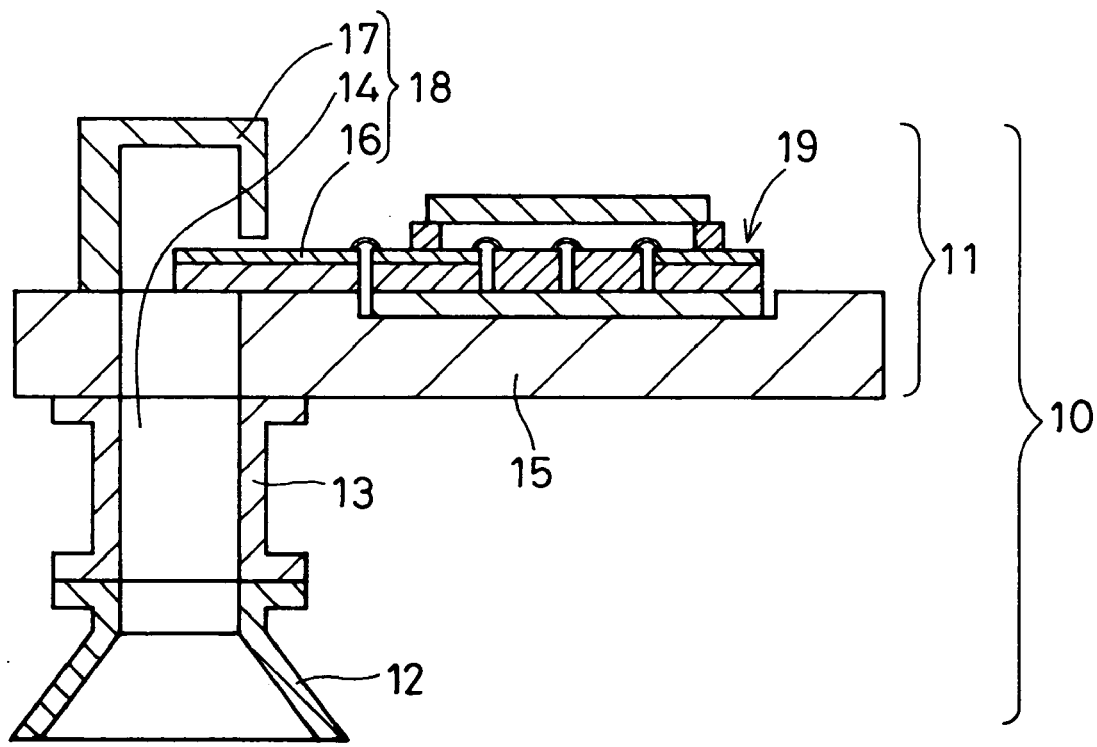
FIG. 14 is a sectional view showing an example of a conventional high frequency line-to-waveguide converter.
Figure 15:
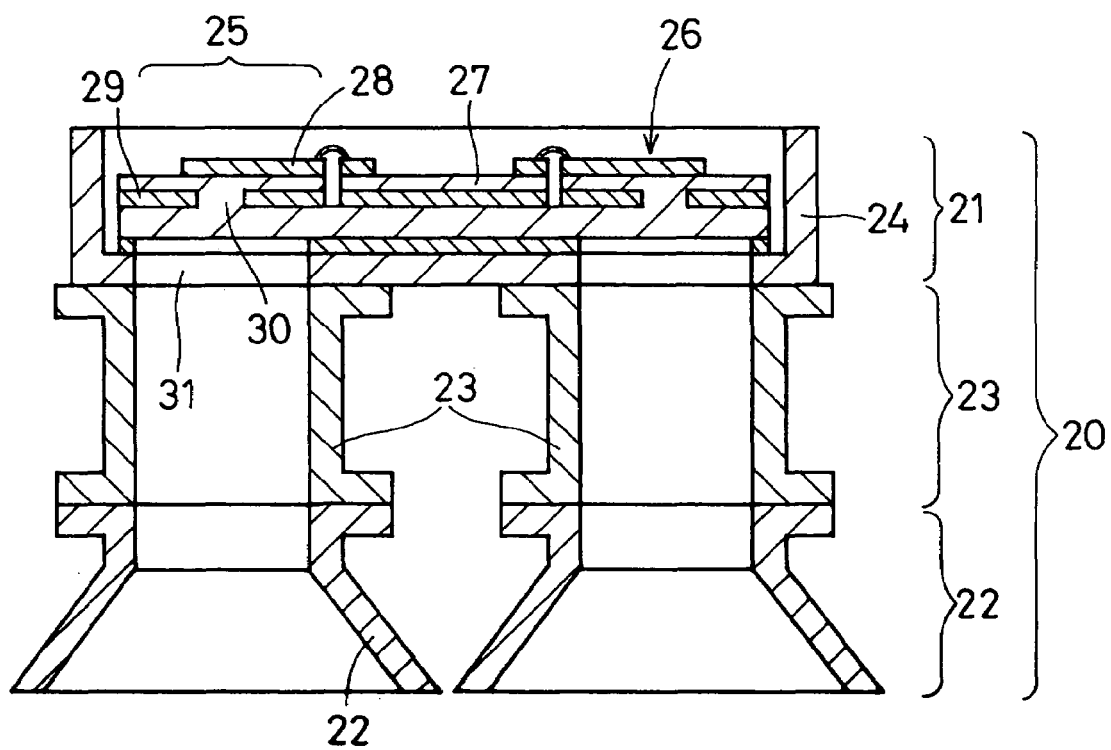
FIG. 15 is a sectional view showing another example of a conventional high frequency line-to-waveguide converter.

Besides, in FIGS. 11A and 11B, although the example has been described in which the end of the high frequency line conductor 126 at the center side of the dielectric substrate 125 is short-circuited to the slot 130 in order to perform the electromagnetic coupling of the high frequency line conductor 126 and the slot 130, the end of the high frequency line conductor 126 at the center side of the dielectric substrate 125 may be opened as shown in FIG. 13 to perform the electromagnetic coupling.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high frequency line-to-waveguide converter comprising:
   a high frequency line including a dielectric layer, a line conductor disposed on one surface of the dielectric layer, and a ground conductor layer disposed on the same surface so as to surround one end of the line conductor, wherein the one end of the line conductor is short-circuited to the ground conductor layer;
a slot formed in the ground conductor layer so as to be substantially orthogonal to the one end of the line conductor and coupled to the high frequency line;
a shield conductor part disposed on a side of or in an inside of the dielectric layer so as to surround the one end of the line conductor and the slot; and
a waveguide disposed on a side of the other surface of the dielectric layer so that an opening is opposite to the one end of the line conductor and the slot, the waveguide extending in a direction from the one surface of the dielectric layer toward the other surface thereof, and being electrically connected to the shield conductor part.

2. The high frequency line-to-waveguide converter of claim 1, wherein the shield conductor part includes a plurality of shield through conductors disposed in the inside of the dielectric layer.

3. The high frequency line-to-waveguide converter of claim 1, wherein a thickness of the dielectric layer is approximately $(2n-1)/4$ (n is a natural number) of a wavelength of a signal transmitted through the high frequency line.

4. The high frequency line-to-waveguide converter of claim 1, wherein a tip of the one end of the line conductor is opened, and a distance between the tip and the slot is approximately $(2n-1)/4$ (n is a natural number) of the wavelength of the signal transmitted through the high frequency line.

5. The high frequency line-to-waveguide converter of claim 1, wherein a tip of the one end of the line conductor is short-circuited to the ground conductor layer, and a distance between the tip and the slot is approximately $(n-1)/2$ (n is a natural number) of the wavelength of the signal transmitted through the high frequency line.

6. The high frequency line-to-waveguide converter of claim 1, further comprising:
a second dielectric layer laminated on the dielectric layer on which the line conductor is disposed; and
one surface ground conductor layer provided on one surface of the second dielectric layer,
whereby the high frequency line is constructed as a coplanar line structure having a ground.

7. The high frequency line-to-waveguide converter of claim 1 further comprising:
an internal ground conductor layer disposed in the inside of the dielectric layer between the ground conductor layer and the waveguide and having a transmission opening for causing an electromagnetic wave of a signal transmitted through the high frequency line to be transmitted between the slot and the wave guide.

8. The high frequency line-to-waveguide converter of claim 7, wherein a distance between the internal ground conductor layer and the opening of the waveguide is approximately $(2n-1)/4$ (n is a natural number) of a wavelength of an electromagnetic wave of a signal transmitted through the high frequency line.

9. The high frequency line-to-waveguide converter of claim 7, wherein an area of the transmission opening is half or less of an area of a region surrounded by the shield conductor part.

10. The high frequency line-to-waveguide converter of claim 7, wherein the shield conductor part includes a plurality of shield through conductors disposed in the inside of the dielectric layer.

11. The high frequency line-to-waveguide converter of claim 7, wherein a tip of the one end of the line conductor is opened, and a distance between the tip and the slot is approximately $(2n-1)/4$ (n is a natural number) of the wavelength of the signal transmitted through the high frequency line.

12. The high frequency line-to-waveguide converter of claim 7, wherein a tip of the one end part of the line conductor is short-circuited to the same surface ground conductor layer, and the distance between the tip and the slot is approximately $(n-1)/2$ (n is a natural number) of the wavelength of the signal transmitted through the high frequency line.

13. The high frequency line-to-waveguide converter of claim 7, wherein the ground conductor layer and the internal ground conductor layer are connected by a connection conductor disposed to pass through the dielectric layer along the transmission opening.

14. The high frequency line-to-waveguide converter of claim 7, further comprising:
a second dielectric layer laminated on the dielectric layer on which the line conductor is disposed; and
one surface ground conductor layer provided on one surface of the second dielectric layer,
whereby the high frequency line is constructed as a coplanar line structure having a ground.

15. A high frequency line-to-waveguide converter comprising:
a high frequency line including a dielectric layer, a line conductor disposed on one surface of the dielectric layer, and a ground conductor layer disposed on the same surface so as to surround one end of the line conductor;
two slots formed in the ground conductor layer so as to be substantially orthogonal to the one end of the line conductor and coupled to the high frequency line,
wherein the two slots are non-connecting;
a shield conductor part disposed on a side of or in an inside of the dielectric layer so as to surround the one end of the line conductor and the slot; and
a waveguide disposed on a side of the other surface of the dielectric layer so that an opening is opposite to the one end of the line conductor and the slots, the waveguide extending in a direction from the one surface of the dielectric layer toward the other surface thereof, and being electrically connected to the shield conductor part.

* * * * *